US012696546B2

(12) United States Patent
Chen et al.

(10) Patent No.: US 12,696,546 B2
(45) Date of Patent: Jul. 28, 2026

(54) DISPLAY SUBSTRATE, MANUFACTURING METHOD AND DISPLAY DEVICE

(71) Applicants: Fuzhou BOE Optoelectronics Technology Co., Ltd., Fuzhou (CN); BOE TECHNOLOGY GROUP CO., LTD., Beijing (CN)

(72) Inventors: Xiaolong Chen, Beijing (CN); Wenchao Wang, Beijing (CN); Xin Fang, Beijing (CN); Sangjin Park, Beijing (CN); Jinliang Wang, Beijing (CN); Jie Lin, Beijing (CN)

(73) Assignees: FUZHOU BOE OPTOELECTRONICS TECHNOLOGY CO., LTD., Fuzhou (CN); BOE TECHNOLOGY GROUP CO., LTD., Beijing (CN)

( * ) Notice: Subject to any disclaimer, the term of this patent is extended or adjusted under 35 U.S.C. 154(b) by 391 days.

(21) Appl. No.: 18/554,985

(22) PCT Filed: Dec. 23, 2022

(86) PCT No.: PCT/CN2022/141235
§ 371 (c)(1),
(2) Date: Oct. 11, 2023

(87) PCT Pub. No.: WO2024/130672
PCT Pub. Date: Jun. 27, 2024

(65) Prior Publication Data
US 2025/0098304 A1 Mar. 20, 2025

(51) Int. Cl.
*H01L 27/12* (2006.01)
*H10D 86/01* (2025.01)
(Continued)

(52) U.S. Cl.
CPC ......... *H10D 86/60* (2025.01); *H10D 86/0231* (2025.01); *H10D 86/441* (2025.01)

(58) Field of Classification Search
CPC ... H10D 86/60; H10D 86/0231; H10D 86/441
See application file for complete search history.

(56) References Cited

U.S. PATENT DOCUMENTS 10,417,983 B2 * 9/2019 Hu .......................... G11C 19/28
2013/0088265 A1 4/2013 Chen
(Continued)

FOREIGN PATENT DOCUMENTS

CN 102629444 A 8/2012
CN 102956213 A 3/2013
(Continued)

*Primary Examiner* — William C Trapanese
(74) *Attorney, Agent, or Firm* — WHDA, LLP

(57) ABSTRACT

A display substrate includes a driving circuit arranged on a base substrate, the driving circuit includes a first node control circuit including a first transistor and a second transistor; a gate/first/second electrode of the first transistor is electrically connected to a first control terminal/a first voltage terminal/the first node; a gate/first/second electrode of the second transistor is electrically connected to a second control terminal/the first node/a second voltage terminal; the display substrate also includes a first connection structure and a second connection structure arranged on the base substrate; the first transistor is connected to a part of the first connection structure; and/or, the second transistor is connected to a part of the second connection structure.

19 Claims, 10 Drawing Sheets

(51) Int. Cl.
  *H10D 86/40*    (2025.01)
  *H10D 86/60*    (2025.01)

(56)      References Cited

U.S. PATENT DOCUMENTS

| | | | |
|---|---|---|---|
| 2016/0049126 A1 | 2/2016 | Zhang et al. | |
| 2016/0274713 A1 | 9/2016 | Zhang et al. | |
| 2016/0372070 A1 | 12/2016 | Hu et al. | |
| 2022/0301510 A1 | 9/2022 | Ma et al. | |
| 2023/0060545 A1* | 3/2023 | Du | G09G 3/3233 |
| 2024/0135898 A1* | 4/2024 | Ma | G09G 3/3677 |

FOREIGN PATENT DOCUMENTS

| | | | |
|---|---|---|---|
| CN | 103943055 A | 7/2014 | |
| CN | 104036738 A | 9/2014 | |
| CN | 104517556 A | 4/2015 | |
| CN | 104575436 A | 4/2015 | |
| CN | 106228927 A | 12/2016 | |
| CN | 111179803 A | 5/2020 | |
| CN | 111210759 A | 5/2020 | |
| CN | 112599069 A | 4/2021 | |
| CN | 110428789 B | 11/2021 | |
| JP | 2006054870 A | 2/2006 | |
| KR | 20170078165 A | 7/2017 | |

* cited by examiner

DISPLAY SUBSTRATE, MANUFACTURING METHOD AND DISPLAY DEVICE

CROSS REFERENCE TO RELATED APPLICATION

The present disclosure is the U.S. national phase of PCT Application No. PCT/CN2022/141235 filed on Dec. 23, 2022, which are incorporated herein by reference in their entireties.

TECHNICAL FIELD

The present disclosure relates to the field of display technology, in particular to a display substrate, a manufacturing method and a display device.

BACKGROUND

In the related art, when switching between the bidirectional scanning driving circuit and the unidirectional scanning driving circuit, since the structure of the bidirectional scanning driving circuit is different from that of the unidirectional scanning driving circuit, a large number of masks need to be changed, leading to high mask cost when improving product compatibility.

SUMMARY

In one aspect, the present disclosure provides in some embodiments a display substrate, including a driving circuit arranged on a base substrate, wherein the driving circuit includes a first node control circuit, and the first node control circuit is configured to control a potential of a first node; the first node control circuit includes a first transistor and a second transistor; a gate electrode of the first transistor is electrically connected to a first control terminal, a first electrode of the first transistor is electrically connected to a first voltage terminal, and a second electrode of the first transistor is electrically connected to the first node; a gate electrode of the second transistor is electrically connected to a second control terminal, a first electrode of the second transistor is electrically connected to the first node, and a second electrode of the second transistor is electrically connected to a second voltage terminal; the display substrate further includes a first connection structure and a second connection structure arranged on the base substrate; the first transistor is connected to a part of the first connection structure; and/or, the second transistor is connected to a part of the second connection structure.

Optionally, the first connection structure includes a first connection portion and a second connection portion, and the first connection portion and the second connection portion are electrically connected through a first via hole, the first connection portion and the second connection portion are arranged in different layers; the first connection portion is arranged in a same layer as the gate electrode of the first transistor; the second connection portion is electrically connected to the first electrode of the first transistor; the second connection structure includes a third connection portion and a fourth connection portion, and the third connection portion and the fourth connection portion are electrically connected through a second via hole; the third connection portion and the first connection portion are arranged in different layers.

Optionally, the display substrate further includes a first metal layer, a second metal layer and a first conductive layer sequentially arranged on the base substrate; wherein the first connection portion and the third connection portion are formed on the first metal layer, the second connection portion and the fourth connection portion are formed on the second metal layer, and the first connection portion is electrically connected to the second connection portion through the first conductive layer, and the third connection portion is electrically connected to the fourth connection portion through the first conductive layer.

Optionally, the display substrate further includes a first metal layer, a first insulating layer and a second metal layer sequentially arranged on the base substrate; wherein the first connection portion and the third connection portion are formed on the first metal layer, and the second connection portion and the fourth connection portion are formed on the second metal layer; the first connection portion is electrically connected to the second connection portion through the first via hole penetrating the first insulating layer, and the third connection portion is electrically connected to the fourth connection portion through the second via hole penetrating the first insulating layer.

Optionally, the first voltage terminal is a first scanning voltage terminal, the second voltage terminal is a second scanning voltage terminal, and the second connection portion is electrically connected to the first scanning voltage terminal; the second electrode of the second transistor is electrically connected to the fourth connection portion, and the third connection portion is electrically connected to the second scanning voltage terminal.

Optionally, the first voltage terminal is a first control terminal, the second voltage terminal is a third voltage terminal, and the gate electrode of the first transistor is electrically connected to the first connection portion, the second electrode of the second transistor is electrically connected to the fourth connection portion and the third voltage terminal.

Optionally, a projection of the first connection structure on the base substrate and a projection of the second connection structure on the base substrate are arranged within a range defined by the driving circuit.

Optionally, the display substrate further includes a third connection structure and a fourth connection structure arranged on the base substrate; wherein the control terminal includes a first reset terminal or a second reset terminal; the third connection structure is electrically connected to the first reset terminal, and the fourth connection structure is redundant, or the fourth connection structure is electrically connected to the second reset terminal; the gate electrode of the second transistor is electrically connected to the third connection structure or the fourth connection structure.

Optionally, the driving circuit includes an Nth stage of driving signal output terminal, the first reset terminal is an (N+a)th row of driving signal output terminal, and the second reset terminal is an (N+b)th row of reset terminal, and N, a and b are all positive integers; b is greater than a.

Optionally, the third connection structure includes a fifth connection portion and a sixth connection portion, and the fifth connection portion and the sixth connection portion are electrically connected through a third via hole; the fifth connection portion and the sixth connection portion are arranged in different layers; the fifth connection portion is electrically connected to the first reset terminal; the fourth connection structure includes a seventh connection portion and an eighth connection portion, and the seventh connection portion and the eighth connection portion are electrically connected through a fourth via hole; the seventh connection portion and the eight connection portion are arranged in different layers; the seventh connection portion is electrically connected to the second reset terminal.

Optionally, the display substrate further includes a fifth connection structure arranged on the base substrate; wherein the fifth connection structure includes a ninth connection portion and a tenth connection portion; the ninth connection portion is electrically connected to the tenth connection portion through a fifth via hole, and the ninth connection portion and the tenth connection portion are arranged in different layers; the ninth connection portion is electrically connected to the gate electrode of the second transistor, and the tenth connection portion, the sixth connection portion and the eighth connection portion are arranged in a same layer.

Optionally, the tenth connection portion is electrically connected to the sixth connection portion.

Optionally, the tenth connection portion is electrically connected to the eighth connection portion.

Optionally, the display substrate comprises a first active pattern, a second active pattern and a sixth connection structure arranged on the base substrate; the first active pattern and the second active layer are arranged in a same layer; an area of the second active pattern is larger than an area of the first active pattern; the sixth connection structure includes an eleventh connection portion and a twelfth connection portion; the eleventh connection portion and the twelfth connection portion are electrically connected through a via hole, and the eleventh connection portion and the twelfth connection portion are arranged in different layers.

Optionally, the driving circuit further includes a third transistor; the third transistor includes a gate electrode, a first electrode, and a second electrode; the first active pattern is used as an active pattern of the third transistor; an orthographic projection of the gate electrode of the third transistor on the base substrate at least partially overlaps an orthographic projection of the first active pattern on the base substrate, and an orthographic projection of at least part of the first electrode of the third transistor on the base substrate is within the orthographic projection of the first active pattern on the base substrate, an orthographic projection of at least part of the second electrode of the third transistor on the base substrate is within the orthographic projection of the first active pattern on the base substrate; the gate electrode of the third transistor is electrically connected to a start control terminal, the first electrode of the third transistor is electrically connected to an Nth stage of driving signal output terminal, and the second electrode of the third transistor is electrically connected to the third voltage terminal.

Optionally, the driving circuit further comprises a fourth transistor and a fifth transistor; a gate electrode of the fourth transistor is electrically connected to the start control terminal, a first electrode of the fourth transistor is electrically connected to the first node, and a second electrode of the fourth transistor is electrically connected to the third voltage terminal; a gate electrode of the fifth transistor is electrically connected to the first node, a first electrode of the fifth transistor is electrically connected to a clock signal line, and a second electrode of the fifth transistor is electrically connected to the Nth stage of driving signal output terminal; the gate electrode of the third transistor and the gate electrode of the fourth transistor are arranged in a same layer, and the gate electrode of the third transistor is electrically connected to the gate electrode of the fourth transistor; the first electrode of the third transistor, the second electrode of the third transistor, the first electrode of the fourth transistor, the second electrode of the fourth transistor, the first electrode of the fifth transistor, and the second electrode of the fifth transistor are arranged in a same layer; the first electrode of the third transistor is electrically connected to the second electrode of the fifth transistor.

Optionally, a width-to-length ratio of the third transistor is greater than or equal to 8 and less than or equal to 18.

Optionally, the driving circuit further includes a third transistor; the third transistor includes a gate electrode, a first electrode, and a second electrode; the second active pattern is used as an active pattern of the third transistor; an orthographic projection of the gate electrode of the third transistor on the base substrate at least partially overlaps an orthographic projection of the second active pattern on the base substrate, and an orthographic projection of at least part of the first electrode of the third transistor on the base substrate is within the orthographic projection of the second active pattern on the base substrate, an orthographic projection of at least part of the second electrode of the third transistor on the base substrate is within the orthographic projection of the second active pattern on the base substrate; the gate electrode of the third transistor and the eleventh connection portion are arranged in a same layer, and the gate electrode of the third transistor is electrically connected to the eleventh connection portion; the twelfth connection portion is electrically connected to the first reset terminal.

Optionally, the driving circuit further includes a third transistor; the third transistor includes a gate electrode, a first electrode, and a second electrode; the third active pattern includes the first active pattern and the second active pattern; an orthographic projection of the gate electrode of the third transistor on the base substrate at least partially overlaps an orthographic projection of the third active pattern on the base substrate, and an orthographic projection of at least part of the first electrode of the third transistor on the base substrate is within the orthographic projection of the third active pattern on the base substrate, an orthographic projection of at least part of the second electrode of the third transistor on the base substrate is within the orthographic projection of the third active pattern on the base substrate; the gate electrode of the third transistor and the eleventh connection portion are arranged in a same layer, and the gate electrode of the third transistor is electrically connected to the eleventh connection portion; the twelfth connection portion is electrically connected to the first reset terminal.

Optionally, the display substrate further includes a third connection structure arranged on the base substrate; wherein the third connection structure includes a fifth connection portion, a sixth connection portion and a third via hole, and the fifth connection portion and the sixth connection portion are electrically connected through the third via hole; the fifth connection portion and the sixth connection portion are arranged in different layers; the fifth connection portion is electrically connected to the first reset terminal; the twelfth connection portion and the sixth connection portion are arranged in a same layer, and the twelfth connection portion is electrically connected to the sixth connection portion.

Optionally, the driving circuit further comprises a fifth transistor; a gate electrode of the fifth transistor is electrically connected to the first node, a first electrode of the fifth transistor is electrically connected to the clock signal line, and a second electrode of the fifth transistor is electrically connected to the Nth stage of driving signal output terminal; the first electrode of the third transistor, the second electrode of the third transistor, the first electrode of the fifth transistor, and the second electrode of the fifth transistor are arranged in a same layer, and the first electrode of the third transistor is electrically connected to the second electrode of the fifth transistor.

Optionally, a width-to-length ratio of the third transistor is greater than or equal to 900 and less than or equal to 1350.

Optionally, the driving circuit further includes a sixth transistor; the sixth transistor includes a fourth active pattern; a gate electrode of the sixth transistor is electrically connected to the first node, a first electrode of the sixth transistor is electrically connected to a pull-down control node, and a second electrode of the sixth transistor is electrically connected to the third voltage terminal; an orthographic projection of at least part of the first electrode of the sixth transistor on the base substrate and an orthographic projection of at least part of the second electrode of the sixth transistor on the base substrate are both within an orthographic projection of the fourth active pattern on the base substrate.

Optionally, a width-to-length ratio of the sixth transistor may be greater than or equal to 5 and less than or equal to 7, or, the width-to-length ratio of the sixth transistor may be greater than or equal to 10 and less than or equal to 14.

Optionally, the driving circuit further includes a sixth transistor and a seventh transistor; the sixth transistor includes a fourth active pattern, and the seventh transistor includes a fifth active pattern; a gate electrode of the sixth transistor is electrically connected to the first node, a first electrode of the sixth transistor is electrically connected to a first pull-down control node, and a second electrode of the sixth transistor is electrically connected to a third voltage terminal; a gate electrode of the seventh transistor is electrically connected to the first node, a first electrode of the seventh transistor is electrically connected to a second pull-down control node, and a second electrode of the seventh transistor is electrically connected to the third voltage terminal; an orthographic projection of at least part of the first electrode of the sixth transistor on the base substrate and an orthographic projection of at least part of the second electrode of the sixth transistor on the base substrate are both within an orthographic projection of the fourth active pattern on the base substrate; an orthographic projection of at least part of the first electrode of the seventh transistor on the base substrate and an orthographic projection of at least part of the second electrode of the seventh transistor on the base substrate are both within an orthographic projection of the fifth active pattern on the base substrate.

Optionally, a width-to-length ratio of the sixth transistor is greater than or equal to 5 and less than or equal to 7, and a width-to-length ratio of the seventh transistor is greater than or equal to 5 and less than or equal to 7; or the width-to-length ratio of the sixth transistor is greater than or equal to 10 and less than or equal to 14, and the width-to-length ratio of the seventh transistor is greater than or equal to 10 and less than or equal to 14.

In a second aspect, an embodiment of the present disclosure provides a method for manufacturing the display substrate, including: forming the first transistor, the second transistor, the first connection structure, and the second connection structure on the base substrate; arranging the first transistor and the first connection structure to be electrically connected to each other; and/or, arranging the second transistor and the second connection structure to be electrically connected to each other.

Optionally, the method further includes: forming a first metal layer on the base substrate, and performing a patterning process on the first metal layer to form a first connection portion included in the first connection structure, a third connection portion included in the second connection structure, and the gate electrode of the first transistor and the gate electrode of the second transistor; forming a first insulating layer on a side of the first metal layer away from the base substrate; forming a second metal layer on a side of the first insulating layer away from the base substrate, and performing a patterning process on the second metal layer to form a first conductive pattern, a second conductive pattern, the first electrode of the first transistor, and the first electrode of the second transistor; the first conductive pattern including a second connection portion and the first electrode of the first transistor that are integrally formed; the second conductive pattern including a fourth connection portion and the second electrode of the second transistor that are integrally formed; the second connection portion being included in the first connection structure; the fourth connection portion being included in the second connection structure.

Optionally, the method further includes: forming a first metal layer on the base substrate, and performing a patterning process on the first metal layer to form a third conductive pattern, a third connection portion included in a second connection structure, and the gate electrode of the second transistor; the third conductive pattern including a first connection portion and the gate electrode of the first transistor that are integrally formed; the first connection portion being included in the first connection structure; forming a first insulating layer on a side of the first metal layer away from the base substrate; forming a second metal layer on a side of the first insulating layer away from the base substrate, and performing a patterning process on the second metal layer to form a first conductive pattern, a fourth connection portion, the first electrode of the first transistor, the first electrode of the second transistor, and the second electrode of the second transistor; the first conductive pattern including a second connection portion and the first electrode of the first transistor that are integrally formed; the second connection portion being included in the first connection structure.

Optionally, the method further includes: forming a second insulating layer on a side of the second metal layer away from the first insulating layer, forming a via hole penetrating the first insulating layer and the second insulating layer, and a via hole penetrating the second insulating layer; forming a first conductive layer on a side of the second insulating layer away from the second metal layer, so that the first connection portion is electrically connected to the second connection portion through the via hole, and the third connection portion is electrically connected to the fourth connection portion through the via hole.

Optionally, the method further includes: forming a via hole penetrating the first insulating layer, so that the first connection portion is electrically connected to the second connection portion through the via hole, and the third connection portion is electrically connected to the fourth connection portion through the via hole.

Optionally, the method further includes: forming a third connection structure, a fourth connection structure, a first reset terminal, and a second reset terminal on the base substrate; arranging the third connection structure and the first reset terminal to be electrically connected to each other, and the fourth connection structure and the second reset terminal to be electrically connected to each other; arranging the gate electrode of the second transistor be electrically connected to the third connection structure or the fourth connection structure.

Optionally, the method further includes: forming a first metal layer on a base substrate, and performing a patterning process on the first metal layer to form a fourth conductive pattern and a fifth conductive pattern; the fourth conductive pattern including a fifth connection portion and a first conductive connection portion that are integrally formed, the fifth conductive pattern including a seventh connection portion and a second conductive connection portion that are integrally formed; the first conductive connection portion is electrically connected to the first reset terminal, and the second conductive connection portion is electrically connected to the second reset terminal; forming a first insulating layer on a side of the first metal layer away from the base substrate; forming a second metal layer on a side of the first insulating layer away from the base substrate, performing a patterning process on the second metal layer, and forming a sixth connection portion included in the third connection structure and an eighth connection portion included in the fourth connection structure.

Optionally, the method further includes: performing a patterning process on the first metal layer to form a sixth conductive pattern; the sixth conductive pattern including the gate electrode of the second transistor and a ninth connection portion that are integrally formed; performing a patterning process on the second metal layer to form a tenth connection portion.

Optionally, the method further includes: arranging the tenth connection portion and the sixth connection portion to be electrically connected to each other.

Optionally, the method further includes: arranging the tenth connection portion and the eighth connection portion to be electrically connected to each other.

Optionally, the method further includes: forming a second insulating layer on a side of the second metal layer away from the first insulating layer, forming a via hole penetrating the first insulating layer and the second insulating layer, and a via hole penetrating the second insulating layer; forming a first conductive layer on a side of the second insulating layer away from the second metal layer, so that the fifth connection portion is electrically connected to the sixth connection portion through the via hole, and the seventh connection portion is electrically connected to the eighth connection portion through the via hole, the ninth connection portion is electrically connected to the tenth connection portion through the via hole.

Optionally, the method further includes: forming a via hole penetrating the first insulating layer, so that the fifth connection portion is electrically connected to the sixth connection portion through the via hole, and the seventh connection portion is electrically connected to the eighth connection portion through the via hole, the ninth connection portion is electrically connected to the tenth connection portion through the via hole.

In a third aspect, an embodiment of the present disclosure provides a display device, including the display substrate.

DETAILED DESCRIPTION

Figure 1:
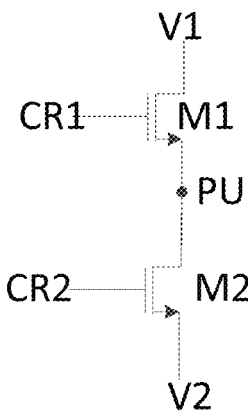
FIG. 1 is a schematic structural diagram of a first transistor and a second transistor included in a driving circuit included in a display substrate according to an embodiment of the present disclosure.

The following will clearly and completely describe the technical solutions in the embodiments of the present disclosure with reference to the accompanying drawings. Obviously, the described embodiments are only some of the embodiments of the present disclosure, not all of them. Based on the embodiments in the present disclosure, all other embodiments obtained by those ordinary skill in the art without making creative work belong to the protection scope of the present disclosure. The embodiments of the present disclosure may be separated or combined, which is not limited herein.

The transistors used in all the embodiments of the present disclosure may be thin film transistors or field effect transistors or other devices with the same characteristics. In the embodiments of the present disclosure, in order to distinguish the two electrodes of the transistor except the gate electrode, one electrode is called the first electrode, and the other electrode is called the second electrode.

In actual operation, when the transistor is a thin film transistor or a field effect transistor, the first electrode may be a drain electrode, and the second electrode may be a source electrode; or, the first electrode may be a source electrode, and the second electrode may be a drain electrode.

The display substrate described in the embodiment of the present disclosure includes a driving circuit arranged on a base substrate, the driving circuit includes a first node control circuit, and the first node control circuit is configured to control a potential of a first node; the first node control circuit node control circuit includes a first transistor and a second transistor;

A gate electrode of the first transistor is electrically connected to a first control terminal, a first electrode of the first transistor is electrically connected to a first voltage terminal, and a second electrode of the first transistor is electrically connected to the first node;

A gate electrode of the second transistor is electrically connected to a second control terminal, a first electrode of the second transistor is electrically connected to the first node, and a second electrode of the second transistor is electrically connected to a second voltage terminal;

The display substrate also includes a first connection structure and a second connection structure arranged on the base substrate;

The first transistor is connected to a part of the first connection structure; and/or, the second transistor is connected to a part of the second connection structure.

It should be noted that, in at least one embodiment of the present disclosure, the first voltage terminal and the first control terminal may provide the same signal, or provide different signals, and may be finally connected to one terminal, or two separate terminals.

In the embodiment of the present disclosure, the connection relationship between the first transistor and the first connection structure, and the connection relationship between the second transistor and the second connection structure are set, it can realize switching between bidirectional scanning driving circuit and unidirectional scanning driving circuit by adding two masks.

In the embodiment of the present disclosure, the connection relationship of the first transistor during bidirectional scanning is different from that of the first transistor during unidirectional scanning, and the connection relationship of the second transistor during bidirectional scanning is different from that of the second transistor during unidirectional scanning, in the embodiment of the present disclosure, only two masks are added (the two masks can be the mask used when making the gate metal layer and the mask used when making the source-drain metal layer), which can realize the switching between the bidirectional scanning driving circuit and the unidirectional scanning driving circuit, which can effectively improve product compatibility and save the mask costs. In addition, in the bidirectional scanning structure, the first transistor is subject to influence by a long-term bias voltage, there will be risks of abnormal output or multi output after reliability tests (such as temperature and humidity tests), and the risk will be higher under high temperature conditions, so there are certain risks for bidirectional scanning for wide temperature products. In at least one embodiment of the present disclosure, the bidirectional scanning structure is changed into a unidirectional scanning structure through two mask processes, and at the same time the connection relationship of the first transistor is changed during unidirectional scanning to improve the influence of the long-term bias voltage on the first transistor. Therefore, unidirectional scanning can support the use of wide-temperature products. Therefore, at least one embodiment of the present disclosure can enable the circuit to support the unidirectional scanning structure for wide-temperature use and the bidirectional scanning structure on the premise of saving costs, so that the circuit compatibility is stronger.

As shown in FIG. 1, at least one embodiment of the driving circuit includes a first transistor M1 and a second transistor M2;

The gate electrode of the first transistor M1 is electrically connected to the first control terminal CR1, the first electrode of the first transistor M1 is electrically connected to the first voltage terminal V1, and the second electrode of the first transistor M1 is electrically connected to the first node PU;

The gate electrode of the second transistor M2 is electrically connected to the second control terminal CR2, the first electrode of the second transistor M2 is electrically connected to the first node PU, and the second electrode of the second transistor M2 is electrically connected to the second voltage terminal V2.

In at least one embodiment of the present disclosure, during bidirectional scanning, the first voltage terminal may be a first scanning voltage terminal, and the second voltage terminal may be a second scanning voltage terminal;

During unidirectional scanning, the first voltage terminal may be a first control terminal, and the second voltage terminal may be a third voltage terminal.

Optionally, the third voltage terminal may be a low voltage terminal, but not limited thereto.

Figure 2:
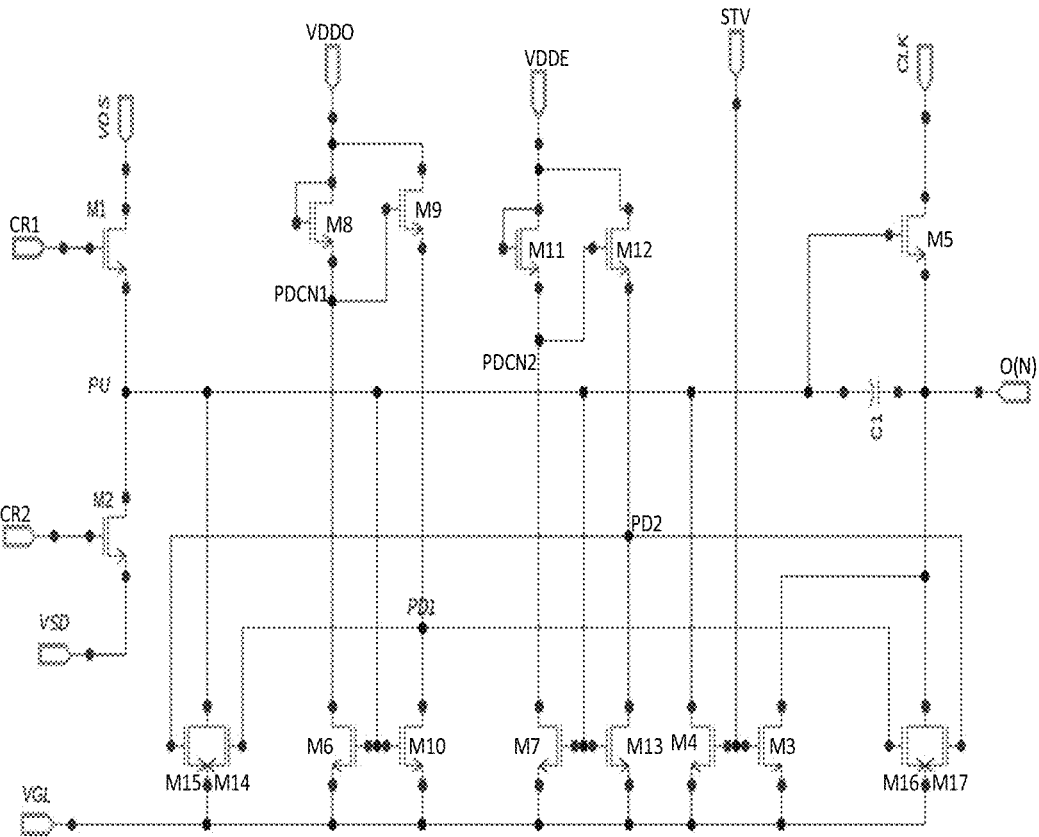
FIG. 2 is a circuit diagram of a bidirectional scanning driving circuit according to an embodiment of the present disclosure.

As shown in FIG. 2, the bidirectional scanning driving circuit of the present disclosure may include a first transistor M1, a second transistor M2, a third transistor M3, a fourth transistor, a fifth transistor, a sixth transistor, a seventh transistor, an eighth transistor, a ninth transistor, a tenth transistor, an eleventh transistor, a twelfth transistor, a thirteenth transistor, a fourteenth transistor, a fifteenth transistor, a sixteenth transistor, a seventeenth transistor and a storage capacitor C1;

The gate electrode of M1 is electrically connected to the first control terminal CR1, the first electrode of M1 is electrically connected to the first scanning voltage terminal VDS, and the second electrode of M1 is electrically connected to the first node PU;

The gate electrode of M2 is electrically connected to the second control terminal CR2, the first electrode of M2 is electrically connected to the first node PU, and the second electrode of M2 is electrically connected to the second scanning voltage terminal VSD;

The gate electrode of M3 is electrically connected to the start control terminal STV. Optionally, the gate electrode of M3 of each stage of GOA unit is electrically connected to the start control terminal STV to receive a start control signal, and M3 is configured to reduce noise on the driving signal output terminal. The first electrode of M3 is electrically connected to the Nth stage of driving signal output terminal O(N), that is, the first electrode of M3 of a current stage of GOA is electrically connected to the driving signal output terminal of the current stage of GOA, and the second electrode of M3 is connected to the low voltage terminal VGL;

The gate electrode of M4 is electrically connected to the start control terminal STV. Optionally, the gate electrode of M4 of each stage of GOA unit is electrically connected to the start control terminal STV to receive the start control signal. M4 is configured to reduce nose on the first node, the first electrode of M4 is electrically connected to the first node PU, and the second electrode of M4 is electrically connected to the low voltage terminal VGL;

The gate electrode of M5 is electrically connected to the first node PU, the first electrode of M5 is electrically connected to the clock signal line CLK, and the second electrode of M5 is electrically connected to the Nth stage of driving signal output terminal O(N);

The gate electrode of M6 is electrically connected to the first node PU, the first electrode of M6 is electrically connected to the first pull-down control node PDCN1, and the second electrode of M6 is electrically connected to the low voltage terminal VGL;

The gate electrode of M7 is electrically connected to the first node PU, the first electrode of M7 is electrically connected to the second pull-down control node PDCN2, and the second electrode of M7 is electrically connected to the low voltage terminal VGL;

Both the gate electrode of M8 and the first electrode of M8 are electrically connected to the first control voltage terminal VDDO, and the second electrode of M8 is electrically connected to the first pull-down control node PDCN1;

The gate electrode of M9 is electrically connected to the first pull-down control node PDCN1, the first electrode of M9 is electrically connected to the first control voltage terminal VDDO, and the second electrode of M9 is electrically connected to the first pull-down node PD1;

The gate electrode of M10 is electrically connected to the first node PU, the first electrode of M10 is electrically connected to the first pull-down node PD1, and the second electrode of M10 is electrically connected to the low voltage terminal VGL;

Both the gate electrode of M11 and the first electrode of M11 are electrically connected to the second control voltage terminal VDDE, and the second electrode of M11 is electrically connected to the second pull-down control node PDCN2;

The gate electrode of M12 is electrically connected to the second pull-down control node PDCN2, the first electrode of M12 is electrically connected to the second control voltage terminal VDDE, and the second electrode of M12 is electrically connected to the second pull-down node PD2;

The gate electrode of M13 is electrically connected to the first node PU, the first electrode of M13 is electrically connected to the second pull-down node PD2, and the second electrode of M13 is electrically connected to the low voltage terminal VGL;

The gate electrode of M14 is electrically connected to the first pull-down node PD1, the first electrode of M14 is electrically connected to the first node PU, and the second electrode of M14 is electrically connected to the low voltage terminal VGL;

The gate electrode of M15 is electrically connected to the second pull-down node PD2, the first electrode of M14 is electrically connected to the first node PU, and the second electrode of M14 is electrically connected to the low voltage terminal VGL;

The gate electrode of M16 is electrically connected to the first pull-down node PD1, the first electrode of M16 is electrically connected to the Nth stage of driving signal output terminal O(N), and the second electrode of M16 is electrically connected to the low voltage terminal VGL;

The gate electrode of M17 is electrically connected to the second pull-down node PD2, the first electrode of M17 is electrically connected to the Nth stage of driving signal output terminal O(N), and the second electrode of M17 is electrically connected to the low voltage terminal VGL;

The first electrode plate of C1 is electrically connected to the first node PU, and the second electrode plate of C1 is electrically connected to the Nth stage of driving signal output terminal O(N);

N is a positive integer.

At least one embodiment of the present disclosure adopts dual noise reduction modules: a first noise reduction module (the first noise reduction module includes M8, M9, M6 and M10) and a second noise reduction module (the second noise reduction module includes M11, M12, M7 and M13), in order to improve the service life of Gate On Array (GOA, the gate driving circuit set on the array substrate), at least one embodiment of the present disclosure can also use a group of noise reduction modules or two adjacent stages of GOA units share a noise reduction module, but not limited thereto.

In the bidirectional scanning driving circuit of the present disclosure shown in FIG. 2, all transistors are n-type transistors, but not limited thereto.

When the bidirectional scanning driving circuit of the present disclosure shown in FIG. 2 is working, In forward scanning, CR1 is the input terminal, CR2 is the reset terminal, VDS is the high voltage terminal, and VSD is the low voltage terminal;

In reverse scanning, CR1 is the reset terminal, CR2 is the input terminal, VDS is the low voltage terminal, and VSD is the high voltage terminal.

When the bidirectional scanning driving circuit of the present disclosure shown in FIG. 2 is working, The CR1 of the first row of GOA units or the CR1 of the first few rows of GOA units can be electrically connected to the start voltage terminal STV0, and connected to the start voltage terminal STV0 to provide the start voltage; the CR1 of other rows of GOA units can be connected to the driving signal output terminal of the next stage(s) of GOA units (the next one or more stage of GOA units is not limited here). Optionally, in the bidirectional scanning structure of the present disclosure, the CR1 of the Nth stage of bidirectional scanning driving circuit can be (N−3)th stage of the driving signal output terminal, the CR2 of the Nth stage of bidirectional scanning driving circuit may be the (N+3)th stage of driving signal output terminal; but it is not limited thereto. In the bidirectional scanning structure, during forward scanning, VDS can input an active level, for example, it can input a high level, and VSD can input an inactive level, for example, it can input a low level; during reverse scanning, VDS can input the invalid level, for example, it can input the low level, VSD can input the active level, for example, it can input the high level.

The bidirectional scanning driving circuit of the present disclosure adopts a non-delayed reset method, for example, the Nth stage of driving circuit can be carried through the (N−3)th stage of driving signal output terminal, and the Nth stage of driving can be reset through the (N+3)th stage of driving signal output terminal, that is, the fourth stage of driving circuit is carried by the first stage of driving signal, and the first stage of driving circuit is reset by the fourth stage of driving signal, so that if the fourth stage of driving circuit outputs abnormally, the first stage of driving circuit will also output abnormally;

However, if the delay reset method is adopted, the fourth stage of driving circuit is carried by the first stage of driving signal, and the first stage of driving circuit is reset by the fifth stage of driving signal. If the fourth stage of driving circuit outputs abnormally, since the first stage of circuit is reset by the fifth stage of driving signal, the first stage of driving circuit will not output abnormally.

In the bidirectional scanning driving circuit, in order to ensure effective competition among the first node PU, the first pull-down node PD1 and the second pull-down node PD2, the size of M6 and the size of M7 should not be too large.

In the bidirectional scanning driving circuit, since the first electrode of M1 is connected to the high voltage during forward scanning, the threshold voltage drift phenomenon of M1 is relatively serious; the second electrode of M2 is connected to the high voltage during reverse scanning, the threshold voltage drift phenomenon of M2 is relatively serious, and the current leakage of the PU is serious. When M6 and M7 are turned on abnormally due to the current leakage, if the size of M6 and the size of M7 are large, the potential of the pull-down control node will be pulled down, so the size of M6 and the size of M7 should not be too large during bidirectional scanning.

In the bidirectional scanning driving circuit, M1 is prone to subject to characteristic drift, which leads to serious current leakage of PU. If the size of M6 and the size of M7 are too large (when the size of the transistor is large, the current leakage will be larger under the same on degree of the transistor). As a result, the current leakage of the pull-down control node increases, the noise reduction capability of the noise reduction unit decreases, and the driving circuit outputs abnormally.

When the bidirectional scanning driving circuit of the present disclosure is working, between adjacent frames, the start control terminal STV provides a high voltage signal, and M3 and M4 are turned on to reset O(N) and PU. In the bidirectional scanning driving module of the present disclosure, all bidirectional scanning driving circuits can be electrically connected to the start control terminal STV.

Figure 3:
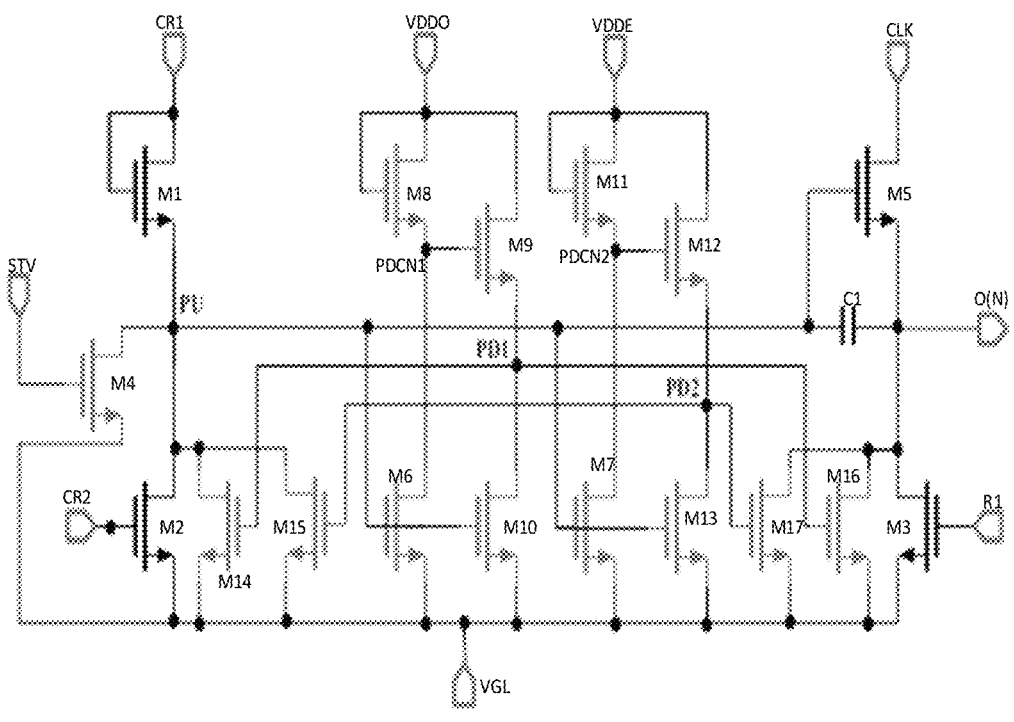
FIG. 3 is a circuit diagram of a unidirectional scanning driving circuit according to an embodiment of the present disclosure.

As shown in FIG. 3, the unidirectional scanning driving circuit of the present disclosure may include a first transistor M1, a second transistor M2, a third transistor M3, a fourth transistor, a fifth transistor, a sixth transistor, a seventh transistor, an eighth transistor, a ninth transistor, a tenth transistor, an eleventh transistor, a twelfth transistor, a thirteenth transistor, a fourteenth transistor, a fifteenth transistor, a sixteenth transistor, a seventeenth transistor and a storage capacitor C1;

The gate electrode of M1 is electrically connected to the first control terminal CR1, the first electrode of M1 is electrically connected to the first control terminal CR1, and the second electrode of M1 is electrically connected to the first node PU;

The gate electrode of M2 is electrically connected to the second control terminal CR2, the first electrode of M2 is electrically connected to the first node PU, and the second electrode of M2 is electrically connected to the low voltage terminal VGL;

The gate electrode of M3 is electrically connected to the first reset terminal R1, the first electrode of M3 is electrically connected to the Nth stage of driving signal output terminal O(N), and the second electrode of M3 is connected to the low voltage terminal VGL;

The gate electrode of M4 is electrically connected to the start control terminal STV, the first electrode of M4 is electrically connected to the first node PU, and the second electrode of M4 is electrically connected to the low voltage terminal VGL;

The gate electrode of M5 is electrically connected to the first node PU, the first electrode of M5 is electrically connected to the clock signal line CLK, and the second electrode of M5 is electrically connected to the Nth stage of driving signal output terminal O(N);

The gate electrode of M6 is electrically connected to the first node PU, the first electrode of M6 is electrically connected to the first pull-down control node PDCN1, and the second electrode of M6 is electrically connected to the low voltage terminal VGL;

The gate electrode of M7 is electrically connected to the first node PU, the first electrode of M7 is electrically connected to the second pull-down control node PDCN2, and the second electrode of M7 is electrically connected to the low voltage terminal VGL;

Both the gate electrode of M8 and the first electrode of M8 are electrically connected to the first control voltage terminal VDDO, and the second electrode of M8 is electrically connected to the first pull-down control node PDCN1;

The gate electrode of M9 is electrically connected to the first pull-down control node PDCN1, the first electrode of M9 is electrically connected to the first control voltage terminal VDDO, and the second electrode of M9 is electrically connected to the first pull-down node PD1;

The gate electrode of M10 is electrically connected to the first node PU, the first electrode of M10 is electrically connected to the first pull-down node PD1, and the second electrode of M10 is electrically connected to the low voltage terminal VGL;

Both the gate electrode of M11 and the first electrode of M11 are electrically connected to the second control voltage terminal VDDE, and the second electrode of M11 is electrically connected to the second pull-down control node PDCN2;

The gate electrode of M12 is electrically connected to the second pull-down control node PDCN2, the first electrode of M12 is electrically connected to the second control voltage terminal VDDE, and the second electrode of M12 is electrically connected to the second pull-down node PD2;

The gate electrode of M13 is electrically connected to the first node PU, the first electrode of M13 is electrically connected to the second pull-down node PD2, and the second electrode of M13 is electrically connected to the low voltage terminal VGL;

The gate electrode of M14 is electrically connected to the first pull-down node PD1, the first electrode of M14 is electrically connected to the first node PU, and the second electrode of M14 is electrically connected to the low voltage terminal VGL;

The gate electrode of M15 is electrically connected to the second pull-down node PD2, the first electrode of M15 is electrically connected to the first node PU, and the second electrode of M15 is electrically connected to the low voltage terminal VGL;

The gate electrode of M16 is electrically connected to the first pull-down node PD1, the first electrode of M16 is electrically connected to the Nth stage of driving signal output terminal O(N), and the second electrode of M16 is electrically connected to the low voltage terminal VGL;

The gate electrode of M17 is electrically connected to the second pull-down node PD2, the first electrode of M17 is electrically connected to the Nth stage of driving signal output terminal O(N), and the second electrode of M17 is electrically connected to the low voltage terminal VGL;

The first electrode plate of C1 is electrically connected to the first node PU, and the second electrode plate of C1 is electrically connected to the Nth stage of driving signal output terminal O(N);

N is a positive integer.

In the unidirectional scanning driving circuit shown in FIG. 3, all transistors are n-type transistors, but not limited thereto, and the transistors may also be p-type transistors during specific implementation.

In the unidirectional scanning driving circuit shown in FIG. 3, the gate electrode of M3 is electrically connected to the first reset terminal R1, the first electrode of M3 is electrically connected to the Nth stage of driving signal output terminal O(N), and the second electrode of M3 is connected to the low voltage terminal VGL, and M3 is configured to control to reset the Nth stage of driving signal output terminal O(N) under the control of the first reset signal provided by the first reset terminal R1, so the size of M3 needs to be set larger. In the bidirectional scanning driving circuit, the gate electrode of M3 is electrically connected to the start control terminal, and the Nth stage of driving signal output terminal O(N) is reset between two frames, and the size of M3 can be smaller.

As shown in FIG. 3, when the unidirectional scanning driving circuit of the present disclosure is working, CR1 of the first row of GOA units or CR1 of the first few rows of GOA can be electrically connected to the start voltage terminal STV0, and receive the start voltage provided by the start voltage terminal STV0, the CR1 of other rows of GOA units can be electrically connected to the driving signal output terminal of the next stage of GOA units (specifically, which next one row of GOA units is not limited here). Optionally, in the unidirectional scanning architecture of the present disclosure, the first control terminal CR1 of the N stage of unidirectional scanning driving circuit can be the (N−3)th stage of driving signal output terminal, the second control terminal CR2 of the N stage of unidirectional scanning driving circuit can be the second reset terminal, and the second reset terminal of the Nth stage of unidirectional scanning driving circuit can be the (N+4)th stage of driving signal output terminal, and the first reset terminal R1 of the Nth stage of unidirectional scanning driving circuit can be the (N+3)th stage of driving signal output terminal, that is, this unidirectional scanning architecture adopts delayed reset, and the cascaded reset relationship in the present disclosure is not limited thereto.

When the unidirectional scanning driving circuit of the present disclosure is working, between adjacent frames, the start control terminal STV provides a high voltage signal, and M4 is turned on to reset the PU. In the unidirectional scanning driving module of the present disclosure, all unidirectional scanning driving circuits can be electrically connected to the start control terminal STV.

There is an essential difference in architecture between the bidirectional scanning driving circuit and the unidirectional scanning driving circuit. The following uses 17T1C as an example to illustrate the difference therebetween.

As shown in FIG. 2, in order to realize switching between forward scanning and reverse scanning, the first electrode of M1 in the bidirectional scanning driving circuit is electrically connected to the first scanning voltage terminal VDS, and the second electrode of M2 is connected to the second scanning voltage terminal VDS. During forward scanning, VDS provides a high voltage signal, and VSD provides a low voltage signal. During reverse scanning, VDS provides a low voltage signal, and VSD provides a high voltage signal. However, because M1 is affected by a large gate bias voltage for a long time, the long-term reliability of the bidirectional scanning driving circuit is poor, especially at high temperatures, so the wide temperature operating performance of bidirectional scanning products is reduced.

In addition to the connection relationship of M1 between the bidirectional scanning driving circuit and the unidirectional scanning driving circuit, the function of M3 is also completely different; as shown in FIG. 2, in the bidirectional scanning driving circuit, M3 is used as the noise reduction unit for the Nth stage of driving signal output terminal O(N), between adjacent frames, STV provides a high voltage signal, M3 is turned on, and noise reduction is performed on the Nth stage of driving signal output terminal O(N). In the unidirectional scanning driving circuit, M3 is used as the discharge unit of the N stage of driving signal output terminal O(N), and resets the N stage of driving signal output terminal O(N) when the reset signal comes, so in order to ensure a short-time reset effect, the size of M3 in the unidirectional scanning driving circuit is generally larger (in the unidirectional scanning driving circuit, the width-to-length ratio of M3 can be more than 60% of the width-to-length ratio of M5). The driving signal noise reduction effect of the unidirectional scanning driving circuit is good, the reliability of the unidirectional scanning driving circuit is good, and wide temperature operation can be realized.

In the bidirectional scanning architecture, in terms of carry and reset logic, in order to ensure the correct carry and reset logic of forward scanning and reverse scan, the bidirectional scanning driving circuit needs to adopt the PU non-delayed reset method. The carry and reset logic is: when carrying, the driving signal output terminal of the Nth stage of bidirectional scanning driving circuit is used as the input signal of the (N+3)th stage of bidirectional scanning driving circuit, and when resetting, the driving signal output terminal of the (N+3)th stage of bidirectional scanning driving circuit is used as the reset signal of the Nth stage of bidirectional scanning driving circuit. In the case of non-delayed reset, if a certain stage of bidirectional scanning driving circuit outputs abnormally, due to the existence of non-delayed reset logic, the abnormal driving signal will be accumulated according to the N+3 situation, resulting in a full-screen periodic screen abnormality.

In the unidirectional scanning architecture, the unidirectional scanning driving circuit adopts the PU delay reset method, and the carry and reset logic thereof is: when carrying, the driving signal output terminal of the Nth stage of bidirectional scanning driving circuit is used as the input signal of the (N+3)th stage of bidirectional scanning driving circuit, when resetting, the driving signal output terminal of the (N+4)th stage of bidirectional scanning driving circuit is used as the reset signal of the Nth stage of bidirectional scanning driving circuit. In the case of delayed reset, if a certain stage of unidirectional scanning driving circuit outputs abnormally, the Nth stage of bidirectional scanning driving circuit will reset the Nth stage of unidirectional scanning driving circuit, thereby blocking the accumulation of abnormal signals, so the reliability of the unidirectional scanning driving circuit is better.

In at least one embodiment of the present disclosure, the signal terminal or signal line for providing the first scanning voltage can be the first scanning voltage terminal VDS, and the signal terminal or signal line for providing the second scanning voltage can be the second scanning voltage line VSD, the signal terminal or the signal line for providing the low voltage signal can be the low voltage terminal VGL.

In at least one embodiment of the present disclosure, the first connection structure includes a first connection portion and a second connection portion, and the first connection portion and the second connection portion are electrically connected through a first via hole, the first connection portion and the second connection portion are arranged in different layers;

The first connection portion is arranged on the same layer as a gate electrode of the first transistor; the second connection portion is electrically connected to a first electrode of the first transistor;

The second connection structure includes a third connection portion and a fourth connection portion, and the third connection portion and the fourth connection portion are electrically connected through a second via hole; the third connection portion and the first connection portion are arranged in different layers.

In a specific implementation, the first connection portion and the gate electrode of the first transistor may be arranged in the same layer and made of the same material.

In specific implementation, the gate electrode of the first transistor, the first connection portion and the third connection portion may be formed on a first metal layer, the second connection portion and the fourth connection portion may be formed on a second metal layer, and the first metal layer may be a gate metal layer, and the second metal layer may be a source-drain metal layer, but not limited thereto.

During specific implementation, a number of the first via holes and a number of the second via holes may be at least one, and there is no limitation on the number of the first via holes and the number of the second via holes.

The display substrate according to at least one embodiment of the present disclosure includes a first metal layer, a second metal layer and a first conductive layer sequentially arranged on the base substrate;

The first connection portion and the third connection portion are formed on the first metal layer, the second connection portion and the fourth connection portion are formed on the second metal layer, and the first connection portion is electrically connected to the second connection portion through the first conductive layer, and the third connection portion is electrically connected to the fourth connection portion through the first conductive layer.

In specific implementation, the first connection portion and the second connection portion may be bridge-connected through the first conductive layer, and the third connection portion and the fourth connection portion may be bridge-connected through the first conductive layer.

Optionally, the first conductive layer may be an indium tin oxide (ITO) layer, but not limited thereto.

The display substrate according to at least one embodiment of the present disclosure includes a first metal layer, a first insulating layer and a second metal layer sequentially arranged on the base substrate;

The first connection portion and the third connection portion are formed on the first metal layer, and the second connection portion and the fourth connection portion are formed on the second metal layer;

The first connection portion is electrically connected to the second connection portion through a first via hole penetrating the first insulating layer, and the third connection portion is electrically connected to the fourth connection portion through a second via hole penetrating the first insulating layer.

In specific implementation, the second metal layer can be used as a bridge, and the material of the second metal layer fills into the first via hole and the second via hole, so that the first connection portion and the second connection portions are electrically connected to each other, the third connection portion and the fourth connection portion are electrically connected to each other.

Figure 4:
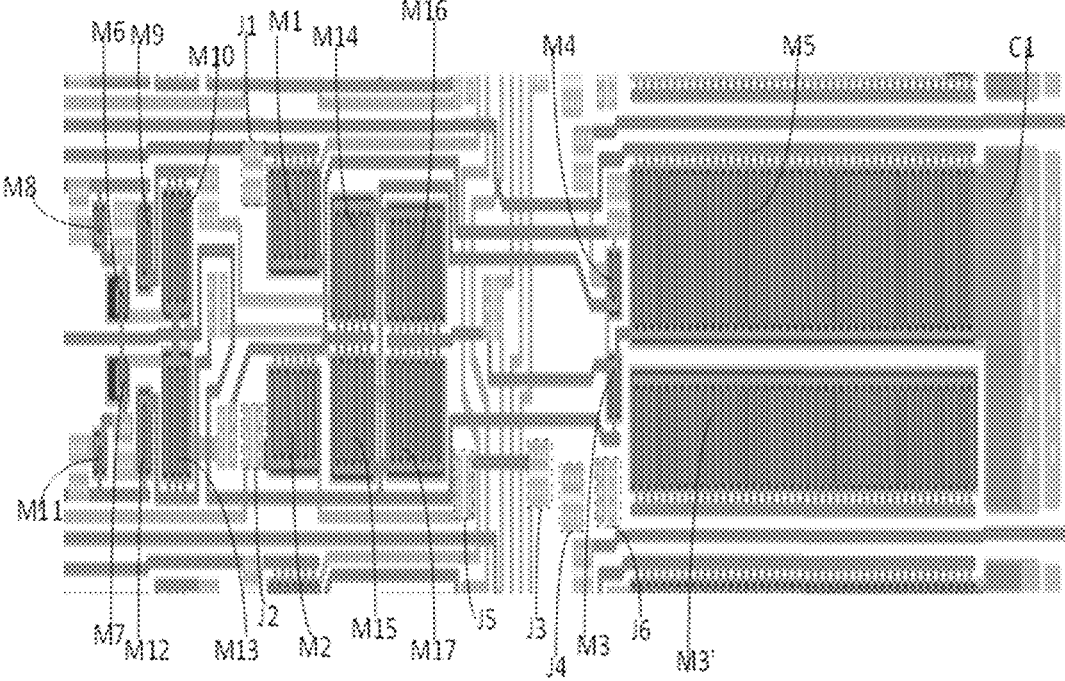
FIG. 4 is a layout diagram of a bidirectional scanning driving circuit included in the display substrate.
Figure 5:
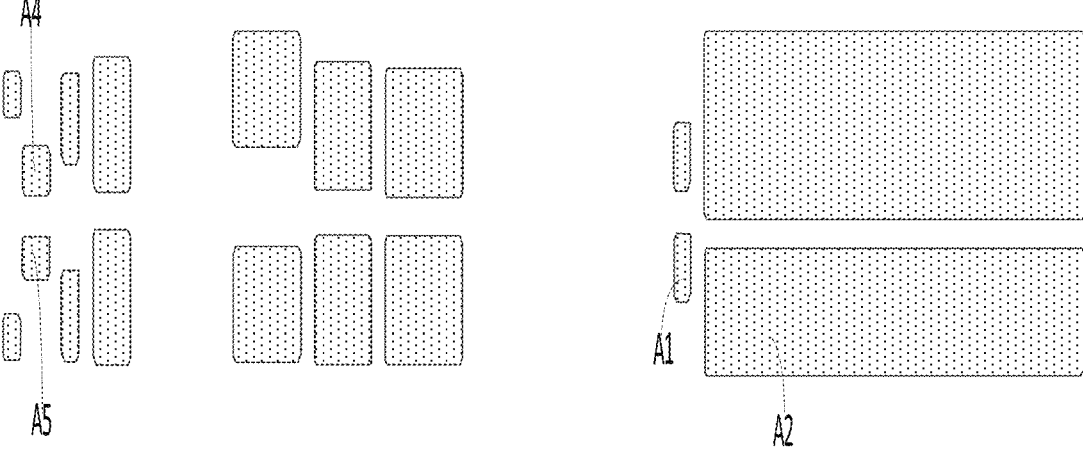
FIG. 5 is a layout view of at least part of the semiconductor layer in FIG. 4.
Figure 6:
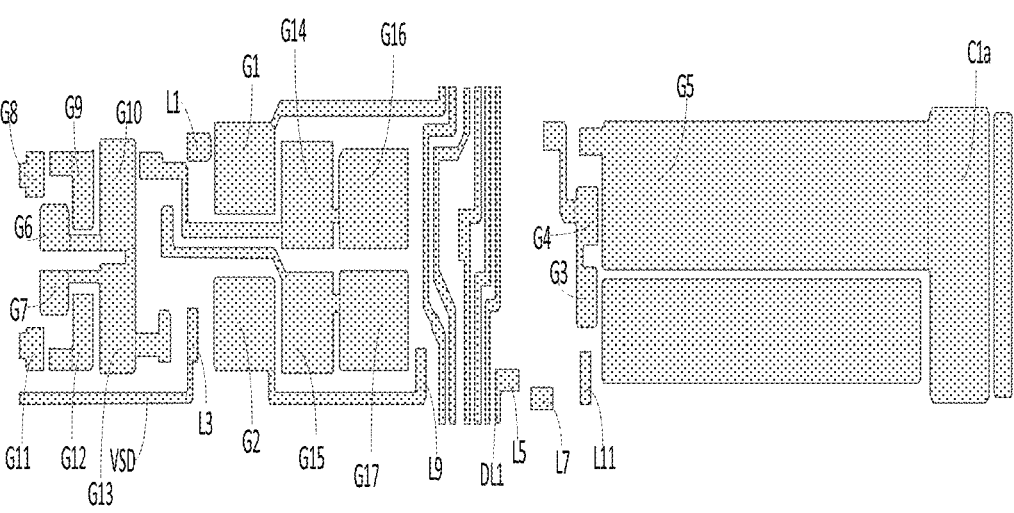
FIG. 6 is a layout diagram of at least part of the gate metal layer in FIG. 4.
Figure 7:
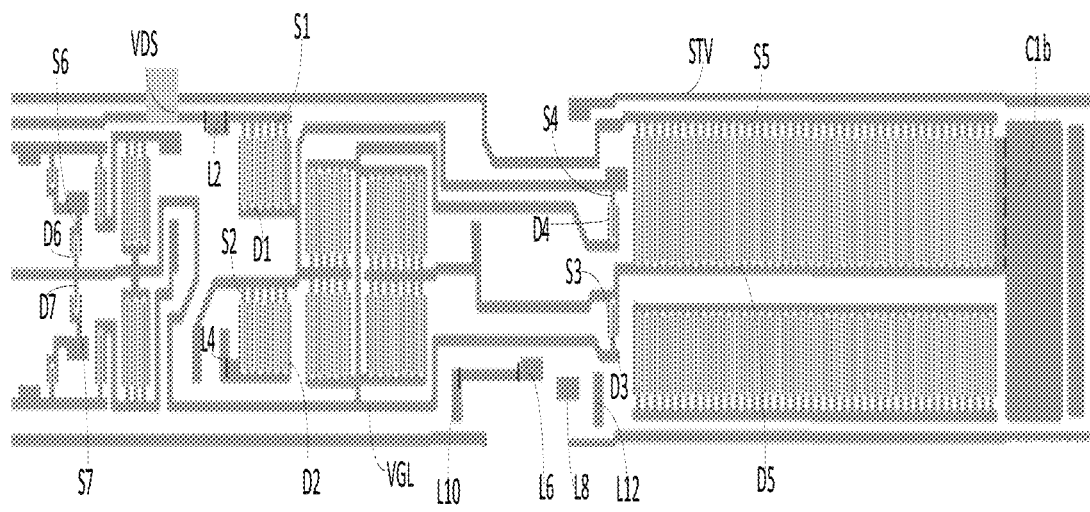
FIG. 7 is a layout diagram of at least part of the source-drain metal layer in FIG. 4.

FIG. 4 is a layout diagram of the bidirectional scanning driving circuit included in the display substrate, FIG. 5 is a layout diagram of at least part of the semiconductor layer in FIG. 4, and FIG. 6 is a layout diagram of at least a part of the gate metal layer in FIG. 4, FIG. 7 is a layout diagram of at least a part of the source-drain metal layer in FIG. 4.

Figure 8:
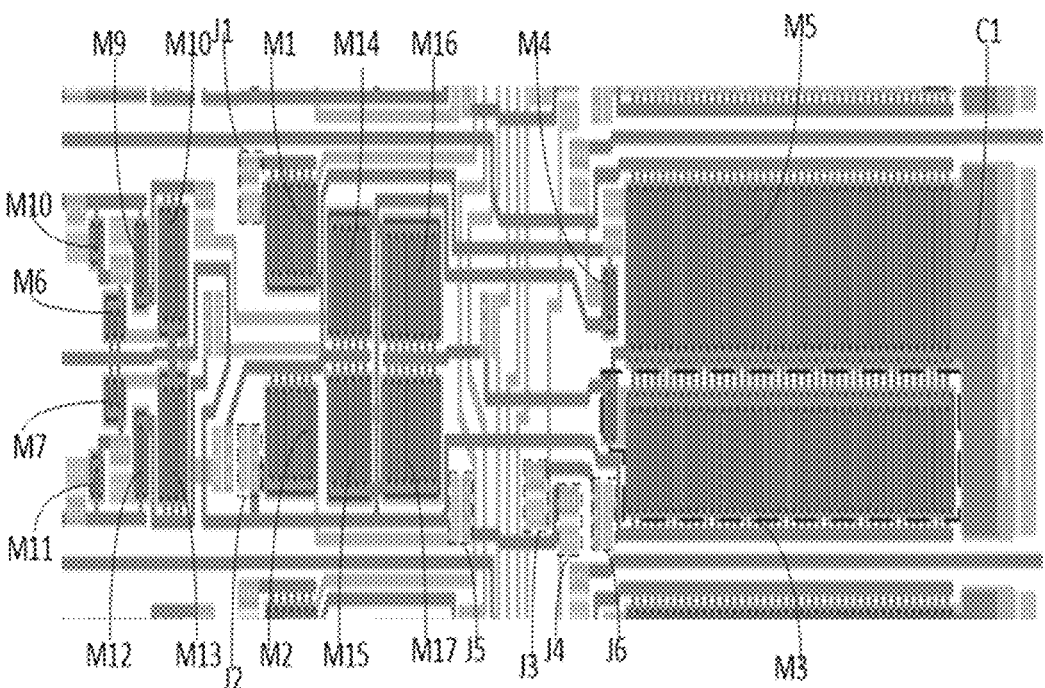
FIG. 8 is a layout diagram of a unidirectional scanning driving circuit included in the display substrate.
Figure 9:
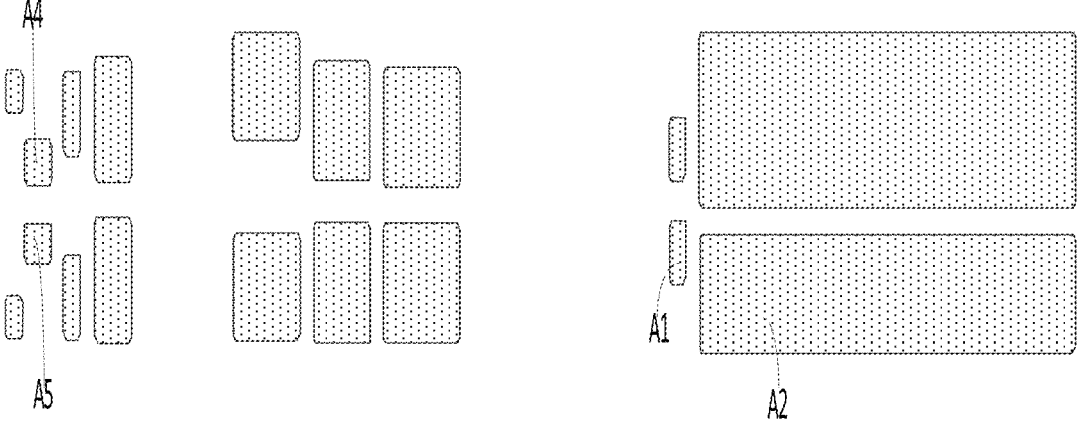
FIG. 9 is a layout view of at least part of the semiconductor layer in FIG. 8.
Figure 10:
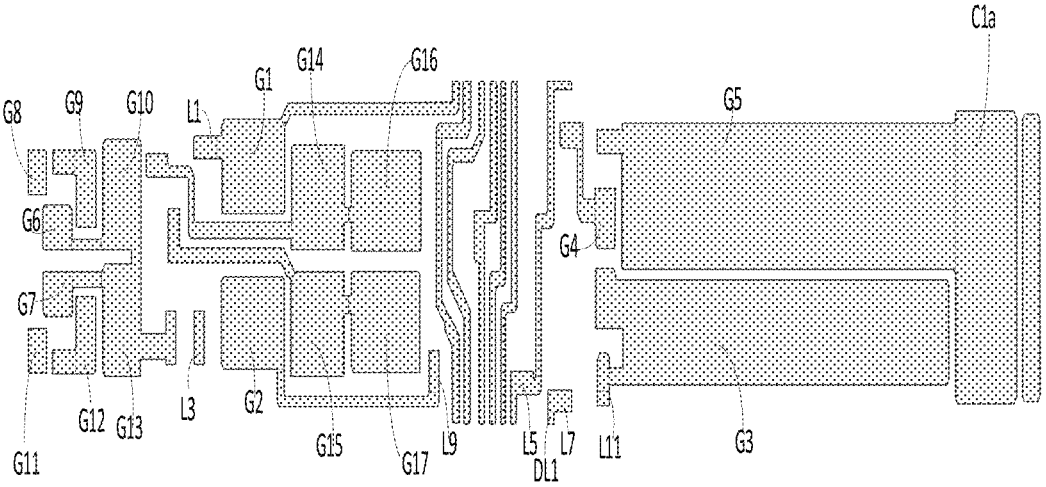
FIG. 10 is a layout diagram of at least part of the gate metal layer in FIG. 8.
Figure 11:
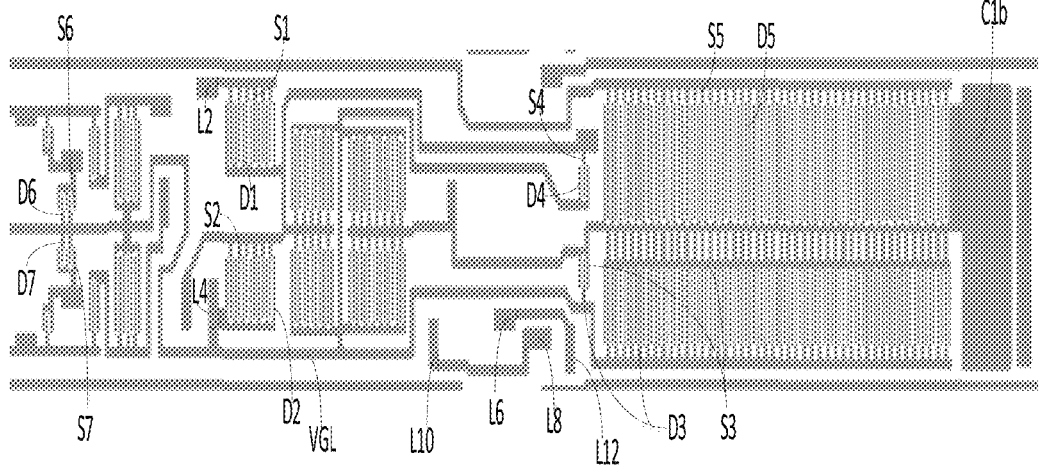
FIG. 11 is a layout diagram of at least part of the source-drain metal layer in FIG. 8.
Figure 12:
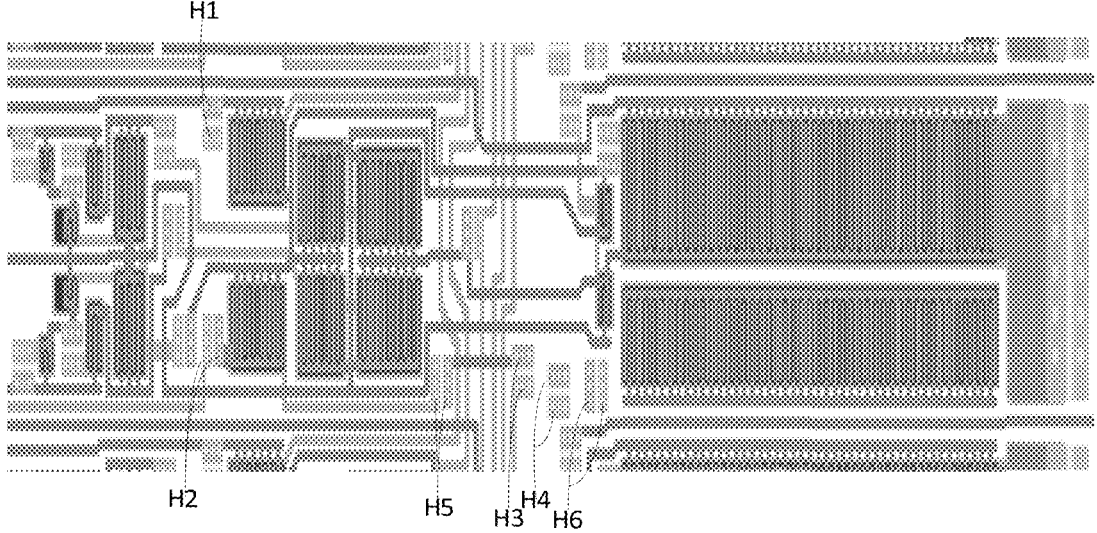
FIG. 12 is a schematic diagram of via holes labeled on the basis of FIG. 4.
Figure 13:
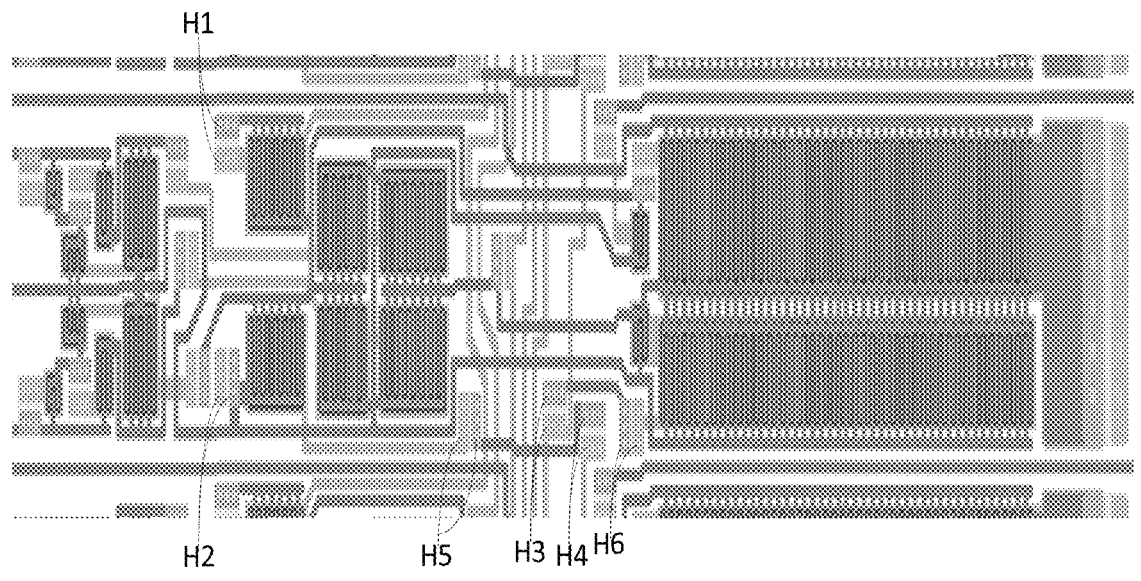
FIG. 13 is a schematic diagram of via holes labeled on the basis of FIG. 8.

FIG. 8 is a layout diagram of the unidirectional scanning driving circuit included in the display substrate, FIG. 9 is a layout diagram of at least part of the semiconductor layer in FIG. 8, and FIG. 10 is a layout diagram of at least part of the gate metal layer in FIG. 8, FIG. 11 is a layout diagram of at least part of the source-drain metal layer in FIG. 8.

In at least one embodiment of the present disclosure, the semiconductor layer may be arranged between the gate metal layer and the source-drain metal layer, but not limited thereto.

As shown in FIG. 4, the one labeled J1 is the first connection structure, the one labeled J2 is the second connection structure, the one labeled M1 is the first transistor, and the one labeled M2 is the second transistor.

As shown in FIGS. 4-13, the first connection structure includes a first connection portion L1 and a second connection portion L2, and the first connection portion L1 is electrically connected to the second connection portion L2 through a first via hole H1, the first connection portion L1 and the second connection portion L2 are arranged in different layers; the first connection portion L1 is formed on the gate metal layer, and the second connection portion L2 is formed on the source-drain metal layer;

The first connection portion L1 and the gate electrode G1 of the first transistor M1 are arranged in the same layer; the second connection portion L2 is electrically connected to the first electrode S1 of the first transistor M1;

The second connection structure includes a third connection portion L3 and a fourth connection portion L4, and the third connection portion L3 is electrically connected to the fourth connection portion L4 through a second via hole H2; the third connection portion L3 and the fourth connection portion L4 are arranged in different layers;

The third connection portion L3 is formed on the gate metal layer, and the fourth connection portion L4 is formed on the source-drain metal layer.

Optionally, in the bidirectional scanning driving circuit, the first voltage terminal is the first scanning voltage terminal, the second voltage terminal is the second scanning voltage terminal, and the second connection portion is electrically connected to the first scanning voltage terminal; the second electrode of the second transistor is electrically connected to the fourth connection portion, and the third connection portion is electrically connected to the second scanning voltage terminal.

As shown in FIG. 6 and FIG. 7, the second connection portion L2 is electrically connected to the first scanning voltage terminal VDS, the second electrode D2 of the second transistor M2 is electrically connected to the fourth connection portion L4, and the third connection portion L3 is electrically connected to the second scanning terminal VSD.

Referring to FIG. 4, FIG. 6 and FIG. 7, in the bidirectional scanning architecture, the vertical projection of the first connection structure J1 on the base substrate and the vertical projection of the second connection structure J2 on the base substrate are arranged in an area defined by the driving circuit, that is, an area where the transistors included in the driving circuit are set. In the bidirectional scanning architecture, a part of structure included in the first connection structure is connected to the first transistor, that is, the second connection portion L2 of the first connection structure J1 is connected to the first electrode of the first transistor, the second connection portion and the first electrode of the first transistor in FIG. 4 are arranged in the same layer, they are directly connected, of course, or connected through other jumper wires, which is not limited herein; the second connection portion L2 of the first connection structure is directly connected to the first scanning voltage terminal VDS, is configured to input the first scanning voltage signal to the first electrode of the first transistor; the first connection portion L1 included in the first connection structure is not directly connected to the first transistor, and the first connection portion L1 and the gate electrode of the first transistor are arranged in the same layer, but not connected to the gate electrode of the first transistor, that is, in the present disclosure, the first scanning voltage signal is transmitted to the first electrode of the first transistor, the signal is transmitted through the second connection portion L2 arranged in the same layer as the first scanning voltage terminal VDS (the first scanning voltage terminal VDS can be a signal line) and the first electrode of the first transistor, the signal will also be transmitted through the first connection portion L1 arranged in different layers from the first scanning voltage terminal VDS (the first scanning voltage terminal VDS can be a signal line) and the first electrode of the first transistor, the first connection portion L1 and the second connection portion L2 are connected through the first conductive layer and the via hole, and the first connection portion L1 is not directly connected to the gate electrode, the source electrode or the drain electrode of the first transistor. The second connection structure J2 includes a third connection portion L3 and a fourth connection portion L4, the third connection portion L3 and the fourth connection portion L4 are arranged in different layers, the third connection portion L3 and the fourth connection portion L4 are connected to the first conductive layer through the via hole, and the second scanning voltage signal provided by the second scanning voltage terminal VSD is transmitted to the second electrode of the second transistor through the third connection portion and the fourth connection portion of the second connection structure.

Referring to FIG. 4, the extension direction of the first connection structure J1 is different from the extension direction of the second connection structure J2, the first connection structure J1 extends toward the row direction, the second connection structure J2 extends toward the column direction, and the first connection structure J1 includes a plurality of via holes, and the plurality of via holes are arranged in two rows extending toward the row direction. The second connection structure J2 includes a plurality of via holes, and the plurality of via holes are arranged in two rows and extending toward the column direction, such extending directions are facilitate to connect the signal lines, for example, the first connection structure is facilitate to connect to the first scanning voltage terminal VDS (the first scanning voltage terminal may be a signal line), and the second connection structure is facilitate to connect to the second scanning voltage terminal VSD (the second scanning voltage terminal may be a signal line); the size of the first connection structure and the size the second connection structure may be approximately the same, and being approximately the same here refers to the same within the process and measurement error range, for example, the error range is within ±2 um.

Optionally, in the unidirectional scanning driving circuit, the first voltage terminal is the first control terminal, the second voltage terminal is the third voltage terminal, and the gate electrode of the first transistor is electrically connected to the first connection portion, the second electrode of the second transistor is electrically connected to the fourth connection portion and the third voltage terminal.

Optionally, the third voltage terminal may be a low voltage terminal, but not limited thereto.

In at least one embodiment of the present disclosure, due to the design of the first connection structure and the second connection structure, two masks (gate layer mask and source-drain layer mask) can be configured to realize the switching between the bidirectional scanning structure and the unidirectional scanning structure, which reduces costs and supports the use of wide temperature products.

As shown in FIG. 8, FIG. 10 and FIG. 11, the gate electrode G1 of M1 is integrally formed with the first connection portion L1, the first electrode S1 of M1 is integrally formed with the second connection portion L2, and the first connection portion L1 is connected to the second connection portion L2, so that the gate electrode G1 of M1 is electrically connected to the first electrode S1 of M1;

The second electrode D2 of the second transistor M2 is electrically connected to the fourth connection portion L4 and the low voltage terminal VGL.

Referring to FIG. 8, FIG. 10 and FIG. 11, in the unidirectional scanning architecture, the vertical projection of the first connection structure J1 on the base substrate and the vertical projection of the second connection structure J2 on the base substrate are arranged in an area defined by the driving circuit (the driving circuit can be Gate On Array (GOA), the gate driving circuit set on the array substrate), that is, an area where a plurality of transistors included in the driving circuit are set. In the unidirectional scanning architecture, a part of the structure included in the second connection structure J2 is connected to the second transistor, that is, the fourth connection portion L4 of the second connection structure J2 is connected to the second electrode of the second transistor. Here, the fourth connection portion and the second electrode of the second transistor in FIG. 8 are arranged in the same layer, directly connected, or connected through other jumper wires, which is not limited here; the fourth connection portion L4 of the second connection structure is directly electrically connected to the third voltage terminal, is configured to inputs a third voltage signal to the second electrode of the second transistor; the third connection portion L3 included in the second connection structure is not directly connected to the second transistor, and the third connection portion is arranged in the same layer as the gate electrode of the second transistor, but not connected to the gate electrode of the second transistor, that is, in the present disclosure, the third voltage signal is transmitted to the second electrode of the second transistor, the signal is transmitted through the fourth connection portion L4 arranged on the same layer as the third voltage terminal (the third voltage terminal may be a signal line) and the second electrode of the second transistor, the signal will also be transmitted through the third connection portion L3 arranged in different layers from the third voltage terminal (the third voltage terminal may be a signal line) and the second electrode of the second transistor, the fourth connection portion and the third connection portion are connected through the first conductive layer and the via hole, and the third connection portion is not directly connected to the gate electrode of the second transistor, the first electrode of the second transistor or the second electrode of the second transistor. The first connection structure J1 includes a first connection portion L1 and a second connection portion L2. The first connection portion and the second connection portion are arranged in different layers. The first connection portion and the second connection portion are connected through the via hole and the first conductive layer. The gate electrode of the first transistor is directly connected to the first connection portion and transmits the signal of the first control terminal. The first electrode of the first transistor is directly connected to the second connection portion. The first voltage terminal is the first control terminal, that is, the first electrode of the first transistor and the gate electrode of the first transistor finally transmits the same signal, and the first control signal will transmitted through the first connection portion and the second connection portion of the first connection structure, and finally be transmitted from the gate electrode of the first transistor to the first electrode of the first transistor.

Referring to FIG. 8, the first connection structure J1 and the second connection structure J2 extend in different directions, the first connection structure extends toward the row direction, the second connection structure extends toward the column direction, the first connection structure includes a plurality of via holes, the plurality of via holes are arranged in two rows extending toward the row direction, and the second connection structure includes a plurality of via holes, and the plurality of via holes are arranged in two rows extending toward the column direction, such extending directions are facilitate to connect to the signal lines, for example, the second connection structure is facilitate to connect to the VGL signal line; the size of the first connection structure and the size of the second connection structure are approximately the same, and being approximately the same refers to the same within the process and measurement error range, for example, the error range is within ±2 um.

In at least one embodiment of the present disclosure, the shortest distance between the orthographic projection of the gate electrode of the first transistor on the base substrate and the orthographic projection of the first connection structure on the base substrate is greater than or equal to 5 um and less than or equal to 20 um; for example, the shortest distance can be 10 um;

The shortest distance between the orthographic projection of the gate electrode of the second transistor on the base substrate and the orthographic projection of the second connection structure on the base substrate is greater than or equal to 5 um and less than or equal to 20 um; for example, the shortest distance may be 10 um. The setting with a close distance is prone to connect the signal and the signal line shall be avoided to be too long.

The display substrate according to at least one embodiment of the present disclosure further includes a third connection structure and a fourth connection structure arranged on the base substrate; the control terminal includes a first reset terminal or a second reset terminal;

The third connection structure is electrically connected to the first reset terminal, and the fourth connection structure is redundant, or the fourth connection structure is electrically connected to the second reset terminal;

The gate electrode of the second transistor is electrically connected to the third connection structure or the fourth connection structure.

In FIG. 4 and FIG. 8, the one labeled J3 is the third connection structure, and the one labeled J4 is the fourth connection structure. Referring to FIG. 4, in the bidirectional scanning architecture, the third connection structure is connected to the driving signal output terminal of the next stage of GOA unit through a signal line, and the signal outputted by the driving signal output terminal of the next stage of GOA unit is finally transmitted to the gate electrode of the second transistor. The fourth connection structure is redundant, and the sixth connection structure is redundant, that is, the fourth connection structure and the sixth connection structure do not realize signal connection and transmission with the transistors included in the GOA at this time.

It should be noted that, optionally, the connection structure provided in the present disclosure includes, for example, a first connection structure, a second connection structure, a third connection structure, a fourth connection structure, a fifth connection structure, a sixth connection structure, etc., the vertical projections of these connection structures on the base substrate are all set within a range of the GOA, that is, set within the range defined by the transistors included in the GOA. In addition, the connection structure includes two connection portions, the two connection portions are arranged in different layers, and connected through the first conductive layer and the via hole. Of course, the connection structure may also include some sub-connection structures, and some sub-connection structures are also fall within the protection scope of the present disclosure, the width of the connection structure is wider than the width of the signal line directly connected to the connection structure, which is facilitate to set via holes to achieve electrical connection through the first conductive layer. For example, referring to FIGS. 4 and 7, the second connection portion included in the first connection structure is wider than the signal line configured to transmit the first scanning voltage, but not limited thereto, and the line width of the connection structure may be equal to or narrower than the signal line directly connected to the connection structure, both of which are within the protection scope of the present disclosure.

As shown in FIGS. 4-7, the third connection structure J3 is electrically connected to the first reset terminal through the first conductive connection portion DL1;

The gate electrode G2 of the second transistor M2 is electrically connected to the third connection structure J3. Referring to FIG. 4, in the bidirectional scanning architecture, the third connection structure J3 is electrically connected to the driving signal output terminal of the next stage of GOA unit, the fourth connection structure J4 and the sixth connection structure J6 are in a floating state, and the dummy transistor M3 adjacent to M5 is also in a floating state. The distance between the dummy transistor M3' and the sixth connection structure J6 is relatively close, for example, the shortest distance is within 40 um, which is facilitate for subsequent connection when using the dummy transistor.

As shown in FIGS. 8-11, the fourth connection structure J4 is electrically connected to the second reset terminal through the second conductive connection portion DL2; that is, the driving output signal of the next stage of GOA is transmitted to the gate electrode of the second transistor through the fourth connection structure, the driving output signal of the (N+4)th stage of GOA is transmitted to the gate electrode of the second transistor through the fourth connection structure; the driving output signal of the next stage of GOA is transmitted to the gate electrode of the third transistor through the third connection structure, and the driving output signal of the (N+3)th stage of GOA is transmitted to the gate electrode of the third transistor through the third connection structure.

The gate electrode G2 of the second transistor M2 is electrically connected to the fourth connection structure J4.

Optionally, the driving circuit includes an Nth stage of driving signal output terminal, the first reset terminal is the (N+a)th row of driving signal output terminal, and the second reset terminal is the (N+b)th row of reset terminal, and N, a and b are all positive integers;

b is greater than a.

For example, b may be equal to 4, and a may be equal to 3, but not limited thereto.

In specific implementation, in the bidirectional scanning driving module, the (N+3)th stage of driving circuit can be carried by the Nth stage of driving signal, and the Nth stage driving circuit can be reset by the (N+3)th stage of driving signal;

In the unidirectional scanning driving module, the (N+3) th stage of driving circuit can be carried by the Nth stage of driving signal, and the Nth stage of driving circuit can be reset by the (N+4)th stage of driving signal.

In at least one embodiment of the present disclosure, the third connection structure includes a fifth connection portion and a sixth connection portion, and the fifth connection portion and the sixth connection portion are electrically connected through a third via hole; the fifth connection portion and the sixth connection portion are located at different layers; the fifth connection portion is electrically connected to the first reset terminal;

The fourth connection structure includes a seventh connection portion and an eighth connection portion, and the seventh connection portion and the eighth connection portion are electrically connected through a fourth via hole; the seventh connection portion and the eight connection portion are arranged in different layers; the seventh connection portion is electrically connected to the second reset terminal.

In a specific implementation, the number of the third via holes and the number of the fourth via holes may be at least one. In at least one embodiment of the present disclosure, the number of the third via holes and the number of the fourth via holes are not limited.

As shown in FIGS. 4-13, the third connection structure J3 includes a fifth connection portion L5 and a sixth connection portion L6; the fifth connection portion L5 is formed on the gate metal layer, and the sixth connection portion L6 is formed on the source-drain metal layer; the fifth connection portion L5 and the sixth connection portion L6 are electrically connected through the third via hole H3;

As shown in FIGS. 4-7, the fifth connection portion L5 is electrically connected to the first reset terminal through the first conductive connection portion DL1; that is, in a plurality of cascaded GOA units, the driving signal output terminal of the next stage of GOA unit is connected to the fifth connection portion L5 through the first conductive connection portion DL1, the fifth connection portion L5 is connected to the sixth connection portion L6 through the third via hole and the conductive layer, the sixth connection portion L6 finally transmits the reset signal to the gate electrode of the second transistor through the tenth connection portion L10 and the fifth connection structure J5. Optionally, in at least one embodiment of the present disclosure, the driving signal output terminal of the (N+3)th stage of GOA unit can provide a reset signal to the gate electrode of M2 of the Nth stage of GOA unit.

As shown in FIGS. 4-13, the fourth connection structure J4 includes a seventh connection portion L7 and an eighth connection portion L8; the seventh connection portion L7 is formed on the gate metal layer, and the eighth connection portion L8 is formed on the source-drain metal layer; the seventh connection portion L7 and the eighth connection portion L8 are electrically connected through the fourth via hole H4; the seventh connection portion L7 and the eighth connection portion L8 are electrically connected through the fourth via hole H4;

As shown in FIGS. 8-11, the seventh connection portion L7 is electrically connected to the second reset terminal through the second conductive connection portion DL2.

The display substrate according to at least one embodiment of the present disclosure further includes a fifth connection structure arranged on the base substrate;

The fifth connection structure includes a ninth connection portion and a tenth connection portion; the ninth connection portion is electrically connected to the tenth connection portion through a fifth via hole, and the ninth connection portion and the tenth connection portion are arranged in different layers;

The ninth connection portion is electrically connected to the gate electrode of the second transistor, and the tenth connection portion, the sixth connection portion and the eighth connection portion are arranged in the same layer.

In a specific implementation, the number of the fifth via hole may be at least one, and the number of the fifth via hole is not limited.

In at least one embodiment of the present disclosure, the tenth connection portion, the sixth connection portion and the eighth connection portion may be arranged in the same layer and made of the same material.

As shown in FIGS. 4-13, the display substrate includes a fifth connection structure J5;

The fifth connection structure J5 includes a ninth connection portion L9 and a tenth connection portion L10; the ninth connection portion L9 is formed on the gate metal layer, and the tenth connection portion L10 is formed on the source-drain metal layer;

A fifth via hole H5 is provided for electrical connection between the ninth connection portion L9 and the tenth connection portion L10;

The ninth connection portion L9 is electrically connected to the gate G2 of the second transistor M2.

Optionally, the tenth connection portion is electrically connected to the sixth connection portion.

As shown in FIGS. 4-7, L10 is electrically connected to L6.

Optionally, the tenth connection portion is electrically connected to the eighth connection portion.

As shown in FIGS. 8-11, L10 is electrically connected to L8.

In at least one embodiment of the present disclosure, the display substrate includes a first active pattern, a second active pattern and a sixth connection structure arranged on a base substrate; the first active pattern and the second active layer are arranged in the same layer;

An area of the second active pattern is larger than an area of the first active pattern;

The sixth connection structure includes an eleventh connection portion and a twelfth connection portion; the eleventh connection portion and the twelfth connection portion are electrically connected through a via hole, and the eleventh connection portion and the twelfth connection portion are arranged in different layers.

Optionally, the first active pattern and the second active pattern may be arranged in the same layer and made of the same material.

In specific implementation, the first active pattern can be used as the active pattern of the third transistor in the bidirectional scanning driving circuit; the second active pattern or the third active pattern can be used as the active pattern of the third transistor in the unidirectional scanning driving circuit. The third active pattern includes a first active pattern and a second active pattern, in the bidirectional scanning driving circuit, a width-to-length ratio of the third transistor is relatively small, in the unidirectional scanning driving circuit, the width-to-length ratio of the third transistor is relatively large.

Optionally, a ratio between the width-to-length ratio of the third transistor in the unidirectional scanning driving circuit and the width-to-length ratio of the third transistor in the bidirectional scanning driving circuit may be greater than or equal to 60 and less than or equal to 150, for example, the ratio can be 90, but not limited thereto.

As shown in FIGS. 4-13, the display substrate includes a first active pattern A1, a second active pattern A2, and a sixth connection structure J6 arranged on the base substrate; the first active pattern A1 and the second active pattern A2 are arranged in the same layer;

The area of the second active pattern A2 is larger than the area of the first active pattern A1;

The sixth connection structure J6 includes an eleventh connection portion L11 and a twelfth connection portion L12; the eleventh connection portion L11 and the twelfth connection portion L12 are electrically connected through a sixth via hole H6, the eleventh connection portion L11 and the twelfth connection portion L12 are arranged in different layers.

As shown in FIGS. 4-13, the eleventh connection portion L11 is formed on the gate metal layer, and the twelfth connection portion L12 is formed on the source-drain metal layer.

In at least one embodiment of the present disclosure, the driving circuit further includes a third transistor; the third transistor includes a gate electrode, a first electrode, and a second electrode;

The first active pattern is used as the active pattern of the third transistor;

An orthographic projection of the gate electrode of the third transistor on the base substrate at least partially overlaps an orthographic projection of the first active pattern on the base substrate, and an orthographic projection of at least part of the first electrode of the third transistor on the base substrate is within the orthographic projection of the first active pattern on the base substrate, an orthographic projection of at least part of the second electrode of the third transistor on the base substrate is within an orthographic projection of the first active pattern on the base substrate;

The gate electrode of the third transistor is electrically connected to the start control terminal, the first electrode of the third transistor is electrically connected to the Nth stage of driving signal output terminal, and the second electrode of the third transistor is electrically connected to the third voltage terminal.

In a specific implementation, in the bidirectional scanning driving circuit, the first active pattern can be used as the active pattern of the third transistor.

As shown in FIGS. 4-7, the driving circuit further includes a third transistor M3;

The first active pattern is used as the active pattern of the third transistor M3;

The orthographic projection of the gate electrode G3 of the third transistor M3 on the base substrate at least partially overlaps the orthographic projection of the first active pattern A1 on the base substrate, and the orthographic projection of the first electrode S3 of the third transistor M3 on the base substrate is within the orthographic projection of the first active pattern A1 on the base substrate, and the orthographic projection of the second electrode D3 of the third transistor M3 on the base substrate is within the orthographic projection of the first active pattern A1 on the base substrate;

The gate electrode G3 of the third transistor M3 is electrically connected to the start voltage terminal STV, the first electrode S3 of the third transistor M3 is electrically connected to the Nth stage of driving signal output terminal, and the second electrode D3 of the third transistor M3 is electrically connected to the low voltage terminal VGL.

Optionally, the driving circuit further includes a fourth transistor and a fifth transistor;

A gate electrode of the fourth transistor is electrically connected to the start control terminal, a first electrode of the fourth transistor is electrically connected to a first node, and a second electrode of the fourth transistor is electrically connected to a third voltage terminal;

A gate electrode of the fifth transistor is electrically connected to the first node, a first electrode of the fifth transistor is electrically connected to a clock signal line, and a second electrode of the fifth transistor is electrically connected to the Nth stage of driving signal output terminal;

A gate electrode of the third transistor and the gate electrode of the fourth transistor are arranged in the same layer, and the gate electrode of the third transistor is electrically connected to the gate electrode of the fourth transistor;

A first electrode of the third transistor, a second electrode of the third transistor, the first electrode of the fourth transistor, the second electrode of the fourth transistor, the first electrode of the fifth transistor, and the second electrode of the fifth transistor are arranged in the same layer;

The first electrode of the third transistor is electrically connected to the second electrode of the fifth transistor.

In at least one embodiment of the present disclosure, the gate electrode of the third transistor and the gate electrode of the fourth transistor can be arranged in the same layer and made of the same material, the first electrode of the third transistor, the second electrode of the third transistor, the first electrode of the fourth transistor, the second electrode of the fourth transistor, the first electrode of the fifth transistor, and the second electrode of the fifth transistor may be arranged in the same layer and made of the same material.

In specific implementation, the driving circuit may further include a fourth transistor and a fifth transistor, and the fourth transistor controls to connect or disconnect the first node and the third voltage terminal under the control of the start control signal provided by the start control terminal, the fifth transistor controls to connect or disconnect the Nth stage of driving signal output terminal and the clock signal line under the control of the potential of the first node.

As shown in FIGS. 4-13, the driving circuit further includes a fourth transistor M4 and a fifth transistor M5;

The one labeled G4 is the gate electrode of M4, and the one labeled G5 is the gate electrode of M5;

The one labeled S4 is the first electrode of M4, the one labeled D4 is the second electrode of M4, the one labeled S5 is the first electrode of M5, and the one labeled D5 is the second electrode of M5;

S4, D4, S5 and D5 are all formed on the source-drain metal layer.

Optionally, the width-to-length ratio of the third transistor may be greater than or equal to 8 and less than or equal to 18. For example, the width-to-length ratio of the third transistor may be 12.5, but not limited thereto.

In a specific implementation, in the bidirectional scanning driving circuit, the width-to-length ratio of the third transistor may be greater than or equal to 8 and less than or equal to 18.

In at least one embodiment of the present disclosure, the driving circuit further includes a third transistor; the third transistor includes a gate electrode, a first electrode, and a second electrode;

The second active pattern is used as the active pattern of the third transistor;

The orthographic projection of the gate electrode of the third transistor on the base substrate at least partially overlaps the orthographic projection of the second active pattern on the base substrate, and the orthographic projection of at least part of the first electrode of the third transistor on the base substrate is within the orthographic projection of the second active pattern on the base substrate, the orthographic projection of at least part of the second electrode of the third transistor on the base substrate is within the orthographic projection of the second active pattern on the base substrate;

The gate electrode of the third transistor and the eleventh connection portion are arranged in the same layer, and the gate electrode of the third transistor is electrically connected to the eleventh connection portion;

The twelfth connection portion is electrically connected to the first reset terminal.

In a specific implementation, in the unidirectional scanning driving circuit, the second active pattern can be used as the active pattern of the third transistor.

Optionally, the gate electrode of the third transistor and the eleventh connection portion may be arranged in the same layer and made of the same material.

In at least one embodiment of the present disclosure, the driving circuit further includes a third transistor; the third transistor includes a gate electrode, a first electrode, and a second electrode; the third active pattern includes the first active pattern and the second active pattern;

The orthographic projection of the gate electrode of the third transistor on the base substrate at least partially overlaps the orthographic projection of the third active pattern on the base substrate, and the orthographic projection of at least part of the first electrode of the third transistor on the base substrate is within the orthographic projection of the third active pattern on the base substrate, the orthographic projection of at least part of the second electrode of the third transistor on the base substrate is within an orthographic projection of the third active pattern on the base substrate;

The gate electrode of the third transistor and the eleventh connection portion are arranged in the same layer, and the gate electrode of the third transistor is electrically connected to the eleventh connection portion;

The twelfth connection portion is electrically connected to the first reset terminal.

In a specific implementation, in the unidirectional scanning driving circuit, the third active pattern can be used as the active pattern of the third transistor; the third active pattern includes the first active pattern and the second active pattern.

The display substrate according to at least one embodiment of the present disclosure further includes a third connection structure arranged on the base substrate;

The third connection structure includes a fifth connection portion, a sixth connection portion and a third via hole, and the fifth connection portion and the sixth connection portion are electrically connected through the third via hole; the fifth connection portion and the sixth connection portion are arranged in different layers; the fifth connection portion is electrically connected to the first reset terminal;

The twelfth connection portion and the sixth connection portion are arranged in the same layer, and the twelfth connection portion is electrically connected to the sixth connection portion.

Optionally, the twelfth connection portion and the sixth connection portion are arranged in the same layer and made of the same material.

As shown in FIGS. 8-11, the one labeled G3 is the gate electrode of M3, the one labeled S3 is the first electrode of M3, and the one labeled D3 is the second electrode of M3;

Both the gate electrode G3 of the third transistor M3 and the eleventh connection portion L11 are formed on the gate metal layer, and the gate electrode of the third transistor M3 is electrically connected to the eleventh connection portion L11;

The twelfth connection portion L12 is electrically connected to the sixth connection portion L6 included in the third connection structure J3. In the unidirectional scanning architecture shown in FIG. 8, the third transistor M3 utilizes the floating dummy transistor M3' in FIG. 4, after the two masks are changed, it has been changed to an M3 with a larger area than the bidirectional scanning structure, which improves the noise reduction capability of the driving signal output terminal.

As shown in FIGS. 8-11, the fifth connection portion L5 is electrically connected to the first reset terminal through the first conductive connection portion DL1, so that the gate electrode G3 of the third transistor M3 is electrically connected to the first reset terminal.

Optionally, the driving circuit further includes a fifth transistor;

A gate electrode of the fifth transistor is electrically connected to the first node, a first electrode of the fifth transistor is electrically connected to the clock signal line, and a second electrode of the fifth transistor is electrically connected to the Nth stage of driving signal output terminal;

The first electrode of the third transistor, the second electrode of the third transistor, the first electrode of the fifth transistor, and the second electrode of the fifth transistor are arranged in the same layer, and the first electrode of the third transistor is electrically connected to the second electrode of the fifth transistor.

In at least one embodiment of the present disclosure, the first electrode of the third transistor, the second electrode of the third transistor, the first electrode of the fifth transistor, and the second electrode of the fifth transistor are arranged in the same layer and made of the same material.

Optionally, the width-to-length ratio of the third transistor is greater than or equal to 900 and less than or equal to 1350. For example, the width-to-length ratio of the third transistor may be 1125, but not limited thereto.

In at least one embodiment of the present disclosure, the driving circuit further includes a sixth transistor; the sixth transistor includes a fourth active pattern;

The gate electrode of the sixth transistor is electrically connected to the first node, the first electrode of the sixth transistor is electrically connected to the pull-down control node, and the second electrode of the sixth transistor is electrically connected to the third voltage terminal;

An orthographic projection of at least part of the first electrode of the sixth transistor on the base substrate and an orthographic projection of at least part of the second electrode of the sixth transistor on the base substrate are both within the orthographic projection of the fourth active pattern on the base substrate.

In a specific implementation, in the bidirectional scanning driving circuit, the width-to-length ratio of the sixth transistor may be greater than or equal to 5 and less than or equal to 7, for example, the width-to-length ratio of the sixth transistor may be 25/4;

In the unidirectional scanning driving circuit, the width-to-length ratio of the sixth transistor may be greater than or equal to 10 and less than or equal to 14, for example, the width-to-length ratio of the sixth transistor may be 12.5;

But not limited to this.

In at least one embodiment of the present disclosure, the driving circuit further includes a sixth transistor and a seventh transistor; the sixth transistor includes a fourth active pattern, and the seventh transistor includes a fifth active pattern;

A gate electrode of the sixth transistor is electrically connected to the first node, a first electrode of the sixth transistor is electrically connected to a first pull-down control node, and a second electrode of the sixth transistor is electrically connected to the third voltage terminal;

A gate electrode of the seventh transistor is electrically connected to the first node, a first electrode of the seventh transistor is electrically connected to a second pull-down control node, and a second electrode of the seventh transistor is electrically connected to the third voltage terminal;

The orthographic projection of at least part of the first electrode of the sixth transistor on the base substrate and the orthographic projection of at least part of the second electrode of the sixth transistor on the base substrate are both within the orthographic projection of the fourth active pattern on the base substrate;

The orthographic projection of at least part of the first electrode of the seventh transistor on the base substrate and the orthographic projection of at least part of the second electrode of the seventh transistor on the base substrate are both within an orthographic projection of the fifth active pattern on the base substrate.

During specific implementation, in the bidirectional scanning driving circuit, the width-to-length ratio of the sixth transistor and the width-to-length ratio of the seventh transistor may be greater than or equal to 5 and less than or equal to 7, for example, the width-to-length ratio of the sixth transistor and the width-to-length ratio of the seventh transistor may be 25/4;

In the unidirectional scanning driving circuit, the width-to-length ratio of the sixth transistor and the width-to-length ratio of the seventh transistor may be greater than or equal to 10 and less than or equal to 14, for example, the width-to-length ratio of the sixth transistor and the width-to-length ratio of the seventh transistor may be 12.5;

But not limited to this.

As shown in FIG. 4-FIG. 13, the one labeled M6 is the sixth transistor, the one labeled M7 is the seventh transistor; the one labeled G6 is the gate electrode of M6, and the one labeled G7 is the gate electrode of M7;

The sixth transistor M6 includes a fourth active pattern A4, and the seventh transistor M7 includes a fifth active pattern A5;

The orthographic projection of the first electrode S6 of the sixth transistor M6 on the base substrate and the orthographic projection of the second electrode D6 of the sixth transistor M6 on the base substrate are both within an orthographic projection of the fourth active pattern A4 on the base substrate;

The orthographic projection of the first electrode S7 of the seventh transistor M7 on the base substrate and the orthographic projection of the second electrode D7 of the seventh transistor M7 on the base substrate are both within an orthographic projection of the fifth active pattern A5 on the base substrate.

In the specific implementation, in order to increase the noise reduction capability of the pull-down node and improve the reliability of the architecture, an amorphous silicon (a-Si) guide platform can be preserved as the active layer spacer of the sixth transistor in the unidirectional scanning driving circuit. The a-Si guide platform is preserved as the active layer spacer of the seventh transistor in the unidirectional scanning driving circuit. Referring to the bidirectional scanning architecture shown in FIG. 4, there is a redundancy (guide platform) between the area of the semiconductor layer corresponding to M6 and the area of the semiconductor layer corresponding to M7, and at least one branch corresponding to the source electrode or drain electrode of the transistor can be set in the redundant part. The semiconductor layers of M6 and M7 exceed the vertical projection of the source electrodes and the drain electrodes of M6 and M7. Referring to FIG. 4, the semiconductor layers corresponding to M6 and M7 each has three branches of the source electrode and the drain electrode. Referring to the unidirectional scanning architecture shown in FIG. 8, the source electrodes and the drain electrodes of M6 and M7 in the unidirectional scanning architecture are arranged on the redundancy of the semiconductor layers corresponding to M6 and M7 in the bidirectional scanning architecture. In FIG. 8, the semiconductor layers corresponding to M6 and M7 each has five branches of the source electrodes and the drain electrodes. As shown in FIG. 4-FIG. 13, the structure of the semiconductor layer in the bidirectional scanning driving circuit is the same as the structure of the semiconductor layer in the unidirectional scanning driving circuit, and the same mask can be used to make the structure of the semiconductor layer in the bidirectional scanning driving circuit and the structure of the semiconductor layer in a unidirectional scanning driving circuit.

In the embodiment of the present disclosure, the change of the two masks can realize the switching from the bidirectional scanning architecture to the unidirectional scanning architecture. For example, referring to FIG. 4 and FIG. 6, the gate electrode of M1 is not connected to L1 in the bidirectional scanning architecture, referring to FIG. 8 and FIG. 10, the gate electrode of M1 is connected to L1 in the unidirectional scanning architecture, that is, two different connection relationships of M1 can be realized by changing the mask of a gate metal layer. Similarly, the unidirectional scanning architecture and the bidirectional scanning architecture include the connection method of M2, include the connection relationship of cascade reset, include the connection relationship of M3, etc., the switching between two architectures can be realized by adjusting the gate metal layer mask and the source-drain metal layer mask, which will not be repeated here.

In FIGS. 4-13, the one labeled C1a is the first electrode plate of the storage capacitor C1, the one labeled C1b is the second electrode plate of the storage capacitor C1, and the one labeled C1 is the storage capacitor.

In FIG. 4-FIG. 13, the one labeled G8 is the gate electrode of M8, the one labeled G9 is the gate electrode of M9, the one labeled G10 is the gate electrode of M10, and the one labeled G11 is the gate electrode of M11, the one labeled G12 is the gate electrode of M12, the one labeled G13 is the gate electrode of M13, the one labeled G14 is the gate electrode of M14, the one labeled G15 is the gate electrode of M15, and the one labeled G16 is the gate electrode of M16, and the one labeled G17 is the gate electrode of M17.

After comparing FIG. 5 and FIG. 9, the structure of the semiconductor layer in FIG. 4 is the same as the structure of the semiconductor layer in FIG. 8, so the change of two masks (the two masks are the masks used when making the gate metal layer and the mask used when making the source-drain metal layer) can realize the switching between the bidirectional scanning driving circuit and the unidirectional scanning driving circuit, In at least one embodiment of the present disclosure, in the bidirectional scanning driving circuit, the width-to-length ratio of M1 may be 600/4, the width-to-length ratio of M2 may be 600/4, the width-to-length ratio of M5 may be 7000/4, and the width-to-length ratio of M9 may be 600/4, the width-to-length ratio of M12 can be 75/4, the width-to-length ratio of M10 and M13 can be 380/4, the width-to-length ratio of M4 can be 50/4, the width-to-length ratio of M8 and M11 can be 25/4, the width-to-length ratio of M14 and M15 can be 600/4, the width-to-length ratio of M16 and M17 can be 800/4, but not limited to this.

The method of manufacturing the display substrate described in the embodiment of the present disclosure is configured to manufacture the above-mentioned display substrate, and the method of manufacturing the display substrate includes:

forming a first transistor, a second transistor, a first connection structure, and a second connection structure on a base substrate;

arranging the first transistor and the first connection structure to be electrically connected to each other; and/or, arranging the second transistor and the second connection structure to be electrically connected to each other.

The method of manufacturing the display substrate described in at least one embodiment of the present disclosure includes:

forming a first metal layer on the base substrate, and perform a patterning process on the first metal layer to form a first connection portion included in the first connection structure, a third connection portion included in the second connection structure, and a gate electrode of the first transistor and a gate electrode of the second transistor;

forming a first insulating layer on a side of the first metal layer away from the base substrate;

forming a second metal layer on a side of the first insulating layer away from the base substrate, and performing a patterning process on the second metal layer to form a first conductive pattern, a second conductive pattern, and a first electrode of the first transistor, a first electrode of the second transistor; the first conductive pattern including a second connection portion and the first electrode of the first transistor that are integrally formed; the second conductive pattern including a fourth connection portion and the second electrode of the second transistor that are integrally formed; the second connection portion being included in the first connection structure; the fourth connection portion being included in the second connection structure.

When the display substrate includes a bidirectional scanning driving circuit, the second connection portion may be configured to be electrically connected to the first electrode of the first transistor, and the fourth connection portion may be configured to be electrically connected to the second electrode of the second transistor.

Optionally, the first metal layer may be a gate metal layer, and the second metal layer may be a source-drain metal layer.

The method of manufacturing the display substrate described in at least one embodiment of the present disclosure includes:

forming a first metal layer on a base substrate, and performing a patterning process on the first metal layer to form a third conductive pattern, a third connection portion included in a second connection structure, and a gate electrode of a second transistor; the third conductive pattern including a first connection portion and the gate electrode of the first transistor that are integrally formed; the first connection portion being included in the first connection structure;

forming a first insulating layer on a side of the first metal layer away from the base substrate;

forming a second metal layer on a side of the first insulating layer away from the base substrate, and performing a patterning process on the second metal layer to form a first conductive pattern, a fourth connection portion, a first electrode of the first transistor, a first electrode of the second transistor, and a second electrode of the second transistor; the first conductive pattern including a second connection portion and the first electrode of the first transistor that are integrally formed; the second connection portion being included in the first connection structure.

When the display substrate includes a unidirectional scanning driving circuit, the first connection portion may be electrically connected to the gate electrode of the first transistor, and the second connection portion may be electrically connected to the first electrode of the first transistor.

In at least one embodiment of the present disclosure, the method of manufacturing the display substrate further includes:

Forming a second insulating layer on a side of the second metal layer away from the first insulating layer, forming a via hole penetrating through the first insulating layer and the second insulating layer, and a via hole penetrating through the second insulating layer;

Forming a first conductive layer on a side of the second insulating layer away from the second metal layer, so that the first connection portion is electrically connected to the second connection portion through the via hole, and the third connection portion is electrically connected to the fourth connection portion through the via hole.

In specific implementation, the first conductive layer (the first conductive layer can be an ITO electrode layer) can be formed on the side of the second insulating layer away from the second metal layer, and the first conductive layer can be used as a bridge to control the first connection portion to be electrically connected to the second connection portion, and control the third connection portion to be electrically connected to the fourth connection portion.

Figure 14:
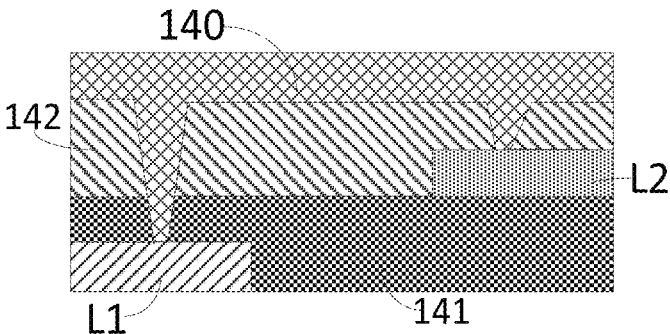
FIG. 14 is a schematic diagram of the connection relationship between two connection portions arranged on different layers.

As shown in FIG. 14, the one labeled L1 is the first connection portion, the one labeled L2 is the second connection portion, the one labeled 141 is the first insulating layer, and the one labeled 142 is the second insulating layer. The first connection portion L1 is formed on the first metal layer, and the second connection portion L2 is formed on the second metal layer. The one labeled 140 is the first conductive layer, and the first conductive layer 140 is used as a bridge to control the first connection portion L1 to be electrically connected to the second connection portion L2. Optionally, the first conductive layer can be an ITO electrode layer. For a display panel including pixel electrodes and common electrodes located in the display area, the first conductive layer can be arranged at the same layer and made of the same material as the pixel electrodes or the common electrodes, the first conductive layer may be an additional electrode layer, which is not limited here.

In at least one embodiment of the present disclosure, the method of manufacturing the display substrate further includes:

forming a via hole penetrating through the first insulating layer, so that the first connection portion is electrically connected to the second connection portion through the via hole, and the third connection portion is electrically connected to the fourth connection portion through the via hole.

In a specific implementation, the second metal layer may be used as a bridge to control the first connection portion to be electrically connected to the second connection portion, and control the third connection portion to be electrically connected to the fourth connection portion.

Figure 15:
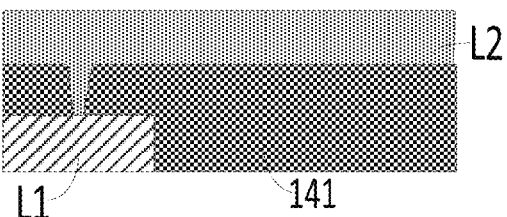
FIG. 15 is a schematic diagram of the connection relationship between two connection portions arranged on different layers.

As shown in FIG. 15, the one labeled L1 is the first connection portion, the one labeled L2 is the second connection portion, and the one labeled 141 is the first insulating layer. The first connection portion L1 is formed on the first metal layer, and the second connection portion L2 is formed on the second metal layer, and the second metal layer is used as a bridge, so that the first connection portion L1 and the second connection portion L2 are electrically connected. In at least one embodiment of the present disclosure, the via hole design between the gate metal layer and the source-drain metal layer can be as shown in FIG. 14 and FIG. 15, but is not limited thereto.

The method of manufacturing the display substrate described in at least one embodiment of the present disclosure may further include:

forming a third connection structure, a fourth connection structure, a first reset terminal, and a second reset terminal on the base substrate;

arranging the third connection structure and the first reset terminal to be electrically connected to each other, and the fourth connection structure and the second reset terminal to be electrically connected to each other;

arranging the gate electrode of the second transistor be electrically connected to the third connection structure or the fourth connection structure.

In specific implementation, in the bidirectional scanning driving circuit, the gate electrode of the second transistor is electrically connected to the first reset terminal through the third connection structure, and in the unidirectional scanning driving circuit, the gate electrode of the second transistor is electrically connected to the second reset terminal through the fourth connection structure.

The method of manufacturing the display substrate described in at least one embodiment of the present disclosure further includes:

forming a first metal layer on a base substrate, and performing a patterning process on the first metal layer to form a fourth conductive pattern and a fifth conductive pattern; the fourth conductive pattern including a fifth connection portion and a first conductive connection portion that are integrally formed, the fifth conductive pattern including a seventh connection portion and a second conductive connection portion that are integrally formed; the first conductive connection portion is electrically connected to the first reset terminal, and the second conductive connection portion is electrically connected to the second reset terminal;

forming a first insulating layer on a side of the first metal layer away from the base substrate;

forming a second metal layer on a side of the first insulating layer away from the base substrate, performing a patterning process on the second metal layer, and forming a sixth connection portion included in the third connection structure and an eighth connection portion included in the fourth connection structure.

In specific implementation, the first conductive connection portion, the second conductive connection portion, the fifth connection portion included in the third connection structure, and the seventh connection portion included in the fourth connection structure can be formed on the base substrate, and then the sixth connection portion included in the third connection structure and the eighth transistor included in the fourth connection structure are formed, and the first conductive connection portion is formed integrally with the fifth connection portion, and the second conductive connection portion is formed integrally with the seventh connection portion.

In at least one embodiment of the present disclosure, the method of manufacturing the display substrate further includes:

performing a patterning process on the first metal layer to form a sixth conductive pattern; the sixth conductive pattern including a gate electrode of the second transistor and a ninth connection portion that are integrally formed;

performing a patterning process on the second metal layer to form a tenth connection portion.

Optionally, the method of manufacturing the display substrate further includes:

Arranging the tenth connection portion and the sixth connection portion to be electrically connected to each other.

In a specific implementation, in the bidirectional scanning driving circuit, the tenth connection portion is electrically connected to the sixth connection portion.

Optionally, the method of manufacturing the display substrate further includes:

Arranging the tenth connection portion and the eighth connection portion to be electrically connected to each other.

In a specific implementation, in the unidirectional scanning driving circuit, the tenth connection portion is electrically connected to the eighth connection portion.

The method of manufacturing the display substrate described in at least one embodiment of the present disclosure further includes:

Forming a second insulating layer on a side of the second metal layer away from the first insulating layer, forming a via hole penetrating through the first insulating layer and the second insulating layer, and a via hole penetrating through the second insulating layer;

Forming the first conductive layer on a side of the second insulating layer away from the second metal layer, so that the fifth connection portion is electrically connected to the sixth connection portion through the via hole, and the seventh connection portion is electrically connected to the eighth connection portion through the via hole, the ninth connection portion is electrically connected to the tenth connection portion through the via hole.

In a specific implementation, the first conductive layer can be formed on the side of the second insulating layer away from the second metal layer, and the first conductive layer can be used as a bridge to control the seventh connection portion to be electrically connected to the eighth connection portion, and control the ninth connection portion to be electrically connected to the tenth connection portion.

The method of manufacturing the display substrate described in at least one embodiment of the present disclosure further includes:

forming a via hole through the first insulating layer, so that the fifth connection portion is electrically connected to the sixth connection portion through the via hole, and the seventh connection portion is electrically connected to the eighth connection portion through the via hole, the ninth connection portion is electrically connected to the tenth connection portion through the via hole.

In a specific implementation, the second metal layer may be used as a bridge to control the seventh connection portion to be electrically connected to the eighth connection portion, and to control the ninth connection portion to be electrically connected to the tenth connection portion.

The display device described in the embodiment of the present disclosure includes the above-mentioned display substrate.

Figure 16:
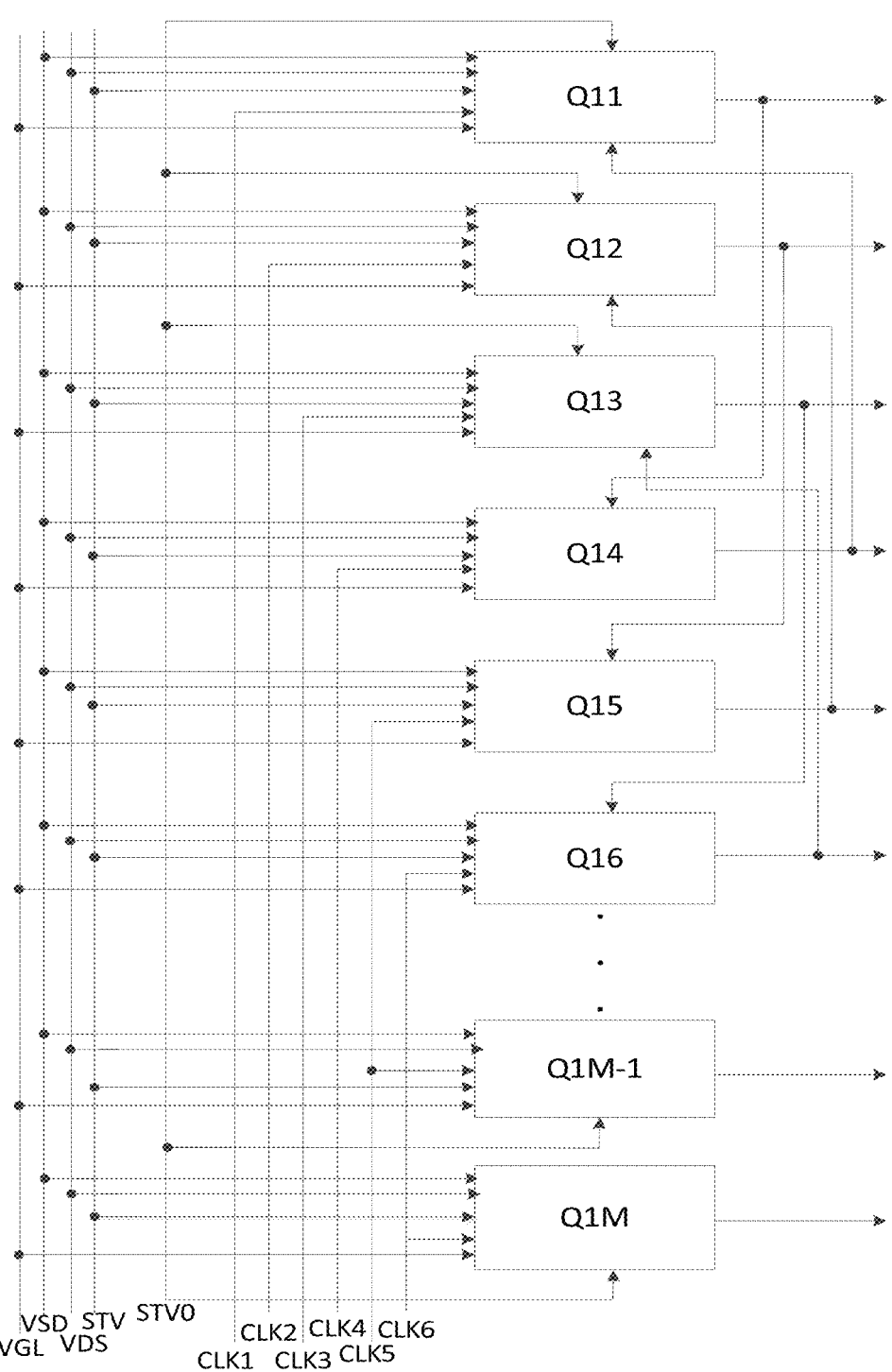
FIG. 16 is a structural diagram of a bidirectional scanning driving module in a display device according to at least one embodiment of the present disclosure.

As shown in FIG. 16, the bidirectional scanning driving module may include M stages of bidirectional scanning driving circuits; M is a positive integer;

The one labeled Q11 is the first stage of bidirectional scanning driving circuit, the one labeled Q12 is the second stage of bidirectional scanning driving circuit, the one labeled Q13 is the third stage of bidirectional scanning driving circuit, and the one labeled Q14 is the fourth stage of bidirectional scanning driving circuit, the one labeled Q15 is the fifth stage of bidirectional scanning driving circuit, the one labeled Q16 is the sixth stage of bidirectional scanning driving circuit, the one labeled Q1M−1 is the (M−1)th stage of bidirectional scanning driving circuit, and the one labeled Q1M is the Mth stage of bidirectional scanning driving circuit;

The driving signal output terminal of Q11 is connected to the first control terminal of Q14, and the driving signal output terminal of Q14 is electrically connected to the second control terminal of Q11;

The driving signal output terminal of Q12 is connected to the first control terminal of Q15, and the driving signal output terminal of Q15 is electrically connected to the second control terminal of Q12;

The driving signal output terminal of Q13 is connected to the first control terminal of Q16, and the driving signal output terminal of Q16 is electrically connected to the second control terminal of Q13;

Q11 is electrically connected to the first clock signal line CK1, Q12 is electrically connected to the second clock signal line CK2, Q13 is electrically connected to the third clock signal line CK3, Q14 is electrically connected to the fourth clock signal line CK4, and Q15 is electrically connected to the fifth clock signal line CK5, Q16 is electrically connected to the sixth clock signal line CK6, Q1M−1 is electrically connected to the fifth clock signal line CK5, and Q1M is electrically connected to the sixth clock signal line CK6;

The first control terminal of Q11, the first control terminal of Q12, and the first control terminal of Q13 may all be connected to the start voltage terminal STV0, and the start voltage terminal STV0 is used to provide an start voltage for the first control terminal of Q11, the first control terminal of Q12 and the first control terminal of Q13.

As shown in FIG. 16, each stage of the gate driving circuit is electrically connected to the STV for noise reduction of the driving output signal O(N) and the PU node, referring to FIG. 16, Q11, Q12, Q13, Q14, Q15, Q16 . . . Q1M−1 and Q1M are all electrically connected to the start control terminal STV.

When the bidirectional scanning driving module shown in FIG. 16 is in operation, between adjacent frames, the start control terminal STV provides a high voltage signal, to reset the driving signal output terminal of each stage of the bidirectional scanning driving circuit and the pull-up node.

Continuing to refer to FIG. 16, the non-display area of the display panel also includes a first scanning voltage terminal VDS, a second scanning voltage terminal VSD and a low voltage terminal VGL, and each stage of GOA units is electrically connected to VDS, VSD and VGL respectively. STV0 provides a start driving signal for the start stage of GOA unit included in the GOA circuit, where the start stage of GOA unit can be a first one stage of GOA unit or first several stages of GOA units. FIG. 16 shows the start driving signal is provided for the first three stages of GOA units, which is not limited. In addition, due to the bidirectional scanning architecture, it scans from Q11 to Q1M during forward scanning, and scans from Q1M to Q11 during reverse scanning. During reverse scanning, STV0 is connected to the last stage of GOA, it may be the last one stage of GOA unit or the last several stages of GOA units, which is not limited here. In the schematic diagram, the last three stages of GOA units may be electrically connected to STVO, but is not limited thereto.

In at least one embodiment of the present disclosure, the first scanning voltage terminal VDS may be a signal terminal or a signal line for transmitting the first scanning voltage, and the second scanning voltage terminal VSD may be a signal line for transmitting the second scanning voltage. The low voltage terminal VGL may be a signal terminal or signal line for transmitting the low voltage signal.

Figure 17:
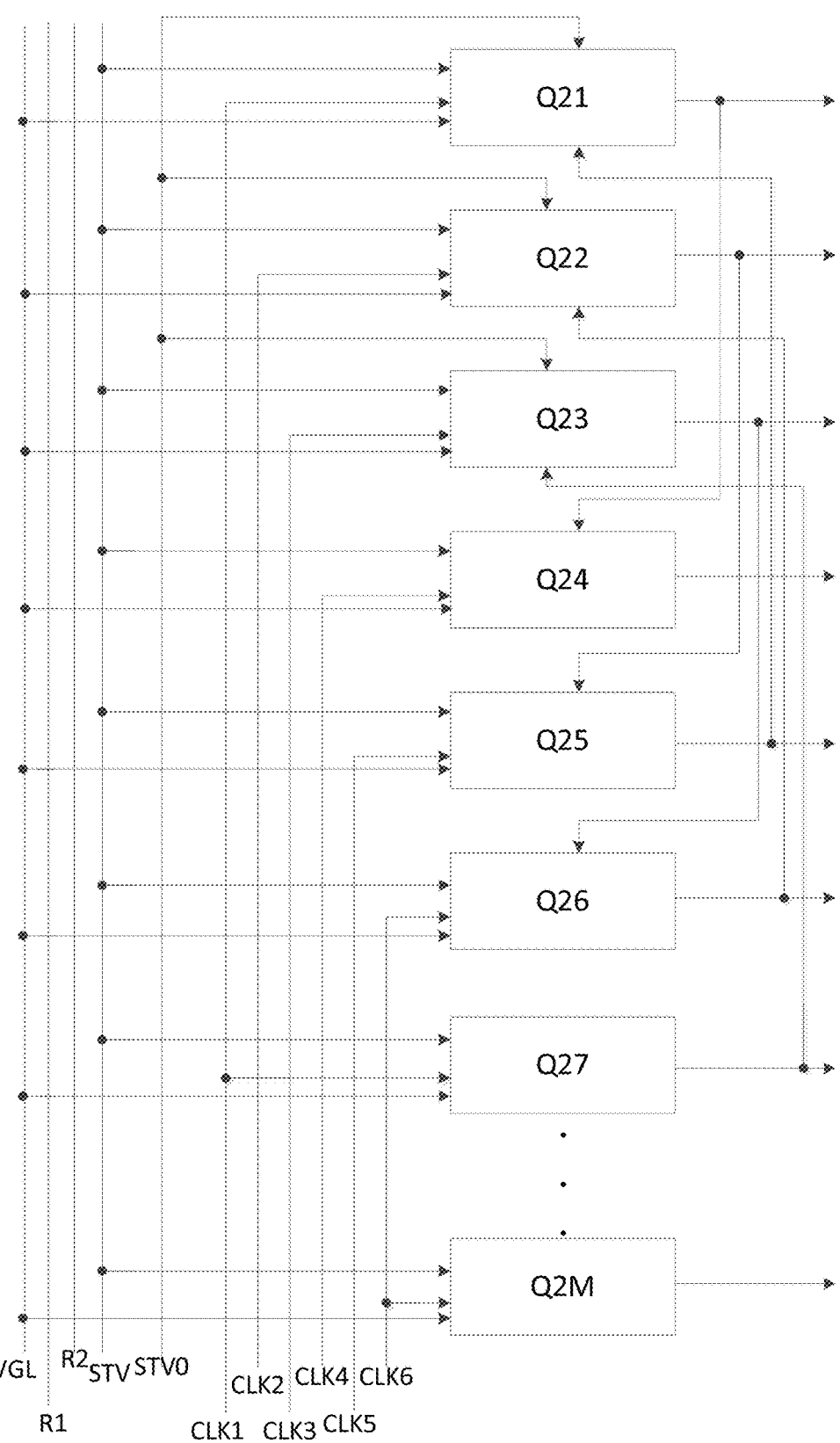
FIG. 17 is a structural diagram of a unidirectional scanning driving module in a display device according to at least one embodiment of the present disclosure.

As shown in FIG. 17, the unidirectional scanning driving module may include M stage of unidirectional scanning driving circuits; M is a positive integer;

The one labeled Q21 is the first stage of bidirectional scanning driving circuit, the one labeled Q22 is the second stage of bidirectional scanning driving circuit, the one labeled Q23 is the third stage of bidirectional scanning driving circuit, and the one labeled Q24 is the fourth stage of bidirectional scanning driving circuit, the one labeled Q25 is the fifth stage of bidirectional scanning driving circuit, the one labeled Q26 is the sixth stage of bidirectional scanning driving circuit, the one labeled Q27 is the seventh stage of bidirectional scanning driving circuit, and the one labeled Q2M is the Mth stage of bidirectional scanning driving circuit;

The driving signal output terminal of Q21 is connected to the first control terminal of Q24, and the driving signal output terminal of Q25 is electrically connected to the second control terminal of Q21;

The driving signal output terminal of Q22 is connected to the first control terminal of Q25, and the driving signal output terminal of Q26 is electrically connected to the second control terminal of Q22;

The driving signal output terminal of Q23 is connected to the first control terminal of Q26, and the driving signal output terminal of Q27 is electrically connected to the second control terminal of Q23;

Q21 is electrically connected to the first clock signal line CK1, Q22 is electrically connected to the second clock signal line CK2, Q23 is electrically connected to the third clock signal line CK3, Q24 is electrically connected to the fourth clock signal line CK4, and Q25 is electrically connected to the fifth clock signal line CK5, Q26 is electrically connected to the sixth clock signal line CK6, Q27 is electrically connected to the first clock signal line CK1, and Q2M is electrically connected to the sixth clock signal line CK6;

The first control terminal of Q21, the first control terminal of Q22, and the first control terminal of Q23 may all be connected to the start voltage terminal STV0, and the start voltage terminal STV0 is used to provide a start voltage for the first control terminal of Q11, the first control terminal of Q12 and the first control terminal of Q13.

As shown in FIGS. 17, Q21, Q22, Q23, Q24, Q25, Q26, Q27 and Q2M are all electrically connected to the start control terminal STV.

When the unidirectional scanning driving module shown in FIG. 17 is in operation, between adjacent frames, the start control terminal STV provides a high voltage signal, to reset the driving signal output terminal of each stage of unidirectional scanning driving circuit and the pull-up node.

Continuing to refer to FIG. 17, redundant signal lines are included in the non-display area of the display panel. The extension direction of the redundant signal lines is the same as that of the clock signal. The redundant signal lines are not connected to the GOA circuit, as shown in FIG. 17, two redundant signal lines are set. Optionally, the redundant signal lines can be electrically connected to the low voltage terminal VGL to jointly provide the low voltage signals for the GOA circuit. In this way, compared with only setting one signal line for providing the low voltage signal, impedance can be reduced.

In FIG. 17, the one labeled R1 is the first redundant signal line, and the one labeled R2 is the second redundant signal line.

Figure 18:
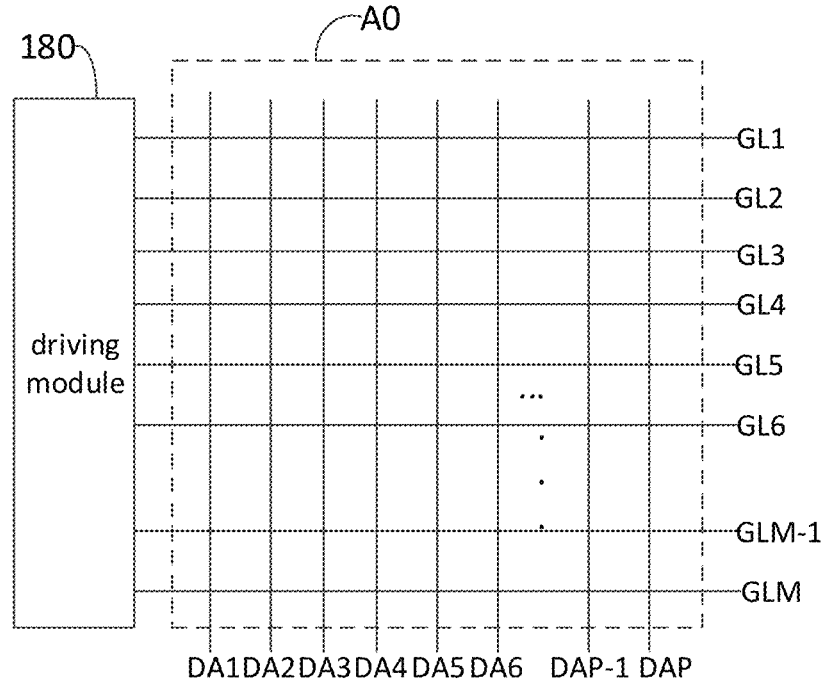
FIG. 18 is a schematic structural diagram of a display substrate according to at least one embodiment of the present disclosure.

In at least one embodiment of the present disclosure, as shown in FIG. 18, the display substrate may include a driving module arranged on the base substrate, and the driving module includes a plurality of stages of driving circuits;

The driving module is arranged in the surrounding area; the one labeled A0 is the display area;

The display substrate also includes a plurality of rows of gate lines and a plurality of columns of data lines;

The driving module 180 is electrically connected to the gate lines, and configured to provide corresponding driving signals for the gate lines.

In FIG. 18, the one labeled GL1 is the first gate line, the one labeled GL2 is the second gate line, the one labeled GL3 is the third gate line, the one labeled GL4 is the fourth gate line, the one labeled GL5 is the fifth gate line, the one labeled GL6 is the sixth gate line, the one labeled GLM−1 is the (M−1)th gate line, and the one labeled GLM is the Mth gate line, where M is a positive integer;

The one labeled DA1 is the first data line, the one labeled DA2 is the second data line, the one labeled DA3 is the third data line, the one labeled DA4 is the fourth data line, and the one labeled DA5 is the fifth data line, the one labeled DA6 is the sixth data line, the one labeled DAP−1 is the (P−1)th data line, and the one labeled DAP is the Pth data line, where P is a positive integer.

The display device provided by the embodiments of the present disclosure may be any product or component with a display function, such as a mobile phone, a tablet computer, a television, a monitor, a notebook computer, a digital photo frame, a navigator, and the like.

The above descriptions are implementations of the present disclosure. It should be pointed out that those skilled in the art can make some improvements and modifications without departing from the principle of the present disclosure. These improvements and modifications shall also fall within the scope of the present disclosure.

What is claimed is:

1. A display substrate, comprising a driving circuit arranged on a base substrate, wherein the driving circuit includes a first node control circuit, and the first node control circuit is configured to control a potential of a first node; the first node control circuit includes a first transistor and a second transistor;

a gate electrode of the first transistor is electrically connected to a first control terminal, a first electrode of the first transistor is electrically connected to a first voltage terminal, and a second electrode of the first transistor is electrically connected to the first node;

a gate electrode of the second transistor is electrically connected to a second control terminal, a first electrode of the second transistor is electrically connected to the first node, and a second electrode of the second transistor is electrically connected to a second voltage terminal;

the display substrate further includes a first connection structure and a second connection structure arranged on the base substrate;

the first transistor is connected to a part of the first connection structure; and/or, the second transistor is connected to a part of the second connection structure, wherein the first connection structure includes a first connection portion and a second connection portion, and the first connection portion and the second connection portion are electrically connected through a first via hole, the first connection portion and the second connection portion are arranged in different layers;

the first connection portion is arranged in a same layer as the gate electrode of the first transistor; the second connection portion is electrically connected to the first electrode of the first transistor;

the second connection structure includes a third connection portion and a fourth connection portion, and the third connection portion and the fourth connection portion are electrically connected through a second via hole; the third connection portion and the first connection portion are arranged in different layers.

2. The display substrate according to claim 1, further comprising a first metal layer, a second metal layer and a first conductive layer sequentially arranged on the base substrate; wherein the first connection portion and the third connection portion are formed on the first metal layer, the second connection portion and the fourth connection portion are formed on the second metal layer, and the first connection portion is electrically connected to the second connection portion through the first conductive layer, and the third connection portion is electrically connected to the fourth connection portion through the first conductive layer;

or wherein the display substrate further comprises the first metal layer, a first insulating layer and the second metal layer sequentially arranged on the base substrate; wherein the first connection portion and the third connection portion are formed on the first metal layer, and the second connection portion and the fourth connection portion are formed on the second metal layer;

the first connection portion is electrically connected to the second connection portion through the first via hole penetrating the first insulating layer, and the third connection portion is electrically connected to the fourth connection portion through the second via hole penetrating the first insulating layer.

3. The display substrate according to claim 1, wherein the first voltage terminal is a first scanning voltage terminal, the second voltage terminal is a second scanning voltage terminal, and the second connection portion is electrically connected to the first scanning voltage terminal; the second electrode of the second transistor is electrically connected to the fourth connection portion, and the third connection portion is electrically connected to the second scanning voltage terminal;

or wherein the first voltage terminal is a first control terminal, the second voltage terminal is a third voltage terminal, and the gate electrode of the first transistor is electrically connected to the first connection portion, the second electrode of the second transistor is electrically connected to the fourth connection portion and the third voltage terminal.

4. The display substrate according to claim 1, wherein a projection of the first connection structure on the base substrate and a projection of the second connection structure on the base substrate are arranged within a range defined by the driving circuit.

5. The display substrate according to claim 1, further comprising a third connection structure and a fourth connection structure arranged on the base substrate; wherein the control terminal includes a first reset terminal or a second reset terminal;

the third connection structure is electrically connected to the first reset terminal, and the fourth connection structure is redundant, or the fourth connection structure is electrically connected to the second reset terminal;

the gate electrode of the second transistor is electrically connected to the third connection structure or the fourth connection structure.

6. The display substrate according to claim 5, wherein the driving circuit includes an Nth stage of driving signal output terminal, the first reset terminal is an (N+a)th row of driving signal output terminal, and the second reset terminal is an (N+b)th row of reset terminal, and N, a and b are all positive integers;

b is greater than a.

7. The display substrate according to claim 5, wherein the third connection structure includes a fifth connection portion and a sixth connection portion, and the fifth connection portion and the sixth connection portion are electrically connected through a third via hole; the fifth connection portion and the sixth connection portion are arranged in different layers; the fifth connection portion is electrically connected to the first reset terminal;

the fourth connection structure includes a seventh connection portion and an eighth connection portion, and the seventh connection portion and the eighth connection portion are electrically connected through a fourth via hole; the seventh connection portion and the eighth connection portion are arranged in different layers; the seventh connection portion is electrically connected to the second reset terminal, wherein the display substrate further includes a fifth connection structure arranged on the base substrate; wherein the fifth connection structure includes a ninth connection portion and a tenth connection portion; the ninth connection portion is electrically connected to the tenth connection portion through a fifth via hole, and the ninth connection portion and the tenth connection portion are arranged in different layers;

the ninth connection portion is electrically connected to the gate electrode of the second transistor, and the tenth connection portion, the sixth connection portion and the eighth connection portion are arranged in a same layer, wherein the tenth connection portion is electrically connected to the sixth connection portion; or wherein the tenth connection portion is electrically connected to the eighth connection portion.

8. The display substrate according to claim 1, wherein the display substrate comprises a first active pattern, a second active pattern and a sixth connection structure arranged on the base substrate; the first active pattern and the second active layer are arranged in a same layer;

an area of the second active pattern is larger than an area of the first active pattern;

the sixth connection structure includes an eleventh connection portion and a twelfth connection portion; the eleventh connection portion and the twelfth connection portion are electrically connected through a via hole, and the eleventh connection portion and the twelfth connection portion are arranged in different layers.

9. The display substrate according to claim 8, wherein the driving circuit further includes a third transistor; the third transistor includes a gate electrode, a first electrode, and a second electrode;

the first active pattern is used as an active pattern of the third transistor;

an orthographic projection of the gate electrode of the third transistor on the base substrate at least partially overlaps an orthographic projection of the first active pattern on the base substrate, and an orthographic projection of at least part of the first electrode of the third transistor on the base substrate is within the orthographic projection of the first active pattern on the base substrate, an orthographic projection of at least part of the second electrode of the third transistor on the base substrate is within the orthographic projection of the first active pattern on the base substrate;

the gate electrode of the third transistor is electrically connected to a start control terminal, the first electrode of the third transistor is electrically connected to an Nth stage of driving signal output terminal, and the second electrode of the third transistor is electrically connected to the third voltage terminal, wherein the driving circuit further comprises a fourth transistor and a fifth transistor;

a gate electrode of the fourth transistor is electrically connected to the start control terminal, a first electrode of the fourth transistor is electrically connected to the first node, and a second electrode of the fourth transistor is electrically connected to the third voltage terminal;

a gate electrode of the fifth transistor is electrically connected to the first node, a first electrode of the fifth transistor is electrically connected to a clock signal line, and a second electrode of the fifth transistor is electrically connected to the Nth stage of driving signal output terminal;

the gate electrode of the third transistor and the gate electrode of the fourth transistor are arranged in a same layer, and the gate electrode of the third transistor is electrically connected to the gate electrode of the fourth transistor;

the first electrode of the third transistor, the second electrode of the third transistor, the first electrode of the fourth transistor, the second electrode of the fourth transistor, the first electrode of the fifth transistor, and the second electrode of the fifth transistor are arranged in a same layer;

the first electrode of the third transistor is electrically connected to the second electrode of the fifth transistor, or wherein a width-to-length ratio of the third transistor is greater than or equal to 8 and less than or equal to 18.

10. The display substrate according to claim 8, wherein the driving circuit further includes a third transistor; the third transistor includes a gate electrode, a first electrode, and a second electrode;

the second active pattern is used as an active pattern of the third transistor;

an orthographic projection of the gate electrode of the third transistor on the base substrate at least partially overlaps an orthographic projection of the second active pattern on the base substrate, and an orthographic projection of at least part of the first electrode of the third transistor on the base substrate is within the orthographic projection of the second active pattern on the base substrate, an orthographic projection of at least part of the second electrode of the third transistor on the base substrate is within the orthographic projection of the second active pattern on the base substrate;

the gate electrode of the third transistor and the eleventh connection portion are arranged in a same layer, and the gate electrode of the third transistor is electrically connected to the eleventh connection portion;

the twelfth connection portion is electrically connected to the first reset terminal;

or wherein the driving circuit further includes the third transistor; the third transistor includes the gate electrode, the first electrode, and the second electrode; the third active pattern includes the first active pattern and the second active pattern;

an orthographic projection of the gate electrode of the third transistor on the base substrate at least partially overlaps an orthographic projection of the third active pattern on the base substrate, and an orthographic projection of at least part of the first electrode of the third transistor on the base substrate is within the orthographic projection of the third active pattern on the base substrate, an orthographic projection of at least part of the second electrode of the third transistor on the base substrate is within the orthographic projection of the third active pattern on the base substrate;

the gate electrode of the third transistor and the eleventh connection portion are arranged in a same layer, and the gate electrode of the third transistor is electrically connected to the eleventh connection portion;

the twelfth connection portion is electrically connected to the first reset terminal.

11. The display substrate according to claim 10, further comprising a third connection structure arranged on the base substrate; wherein the third connection structure includes a fifth connection portion, a sixth connection portion and a third via hole, and the fifth connection portion and the sixth connection portion are electrically connected through the third via hole; the fifth connection portion and the sixth connection portion are arranged in different layers; the fifth connection portion is electrically connected to the first reset terminal;

the twelfth connection portion and the sixth connection portion are arranged in a same layer, and the twelfth connection portion is electrically connected to the sixth connection portion;

or wherein the driving circuit further comprises a fifth transistor;

a gate electrode of the fifth transistor is electrically connected to the first node, a first electrode of the fifth transistor is electrically connected to the clock signal line, and a second electrode of the fifth transistor is electrically connected to the Nth stage of driving signal output terminal;

the first electrode of the third transistor, the second electrode of the third transistor, the first electrode of the fifth transistor, and the second electrode of the fifth transistor are arranged in a same layer, and the first electrode of the third transistor is electrically connected to the second electrode of the fifth transistor;

or wherein a width-to-length ratio of the third transistor is greater than or equal to 900 and less than or equal to 1350.

12. The display substrate according to claim 1, wherein the driving circuit further includes a sixth transistor; the sixth transistor includes a fourth active pattern;

a gate electrode of the sixth transistor is electrically connected to the first node, a first electrode of the sixth transistor is electrically connected to a pull-down control node, and a second electrode of the sixth transistor is electrically connected to the third voltage terminal;

an orthographic projection of at least part of the first electrode of the sixth transistor on the base substrate and an orthographic projection of at least part of the second electrode of the sixth transistor on the base substrate are both within an orthographic projection of the fourth active pattern on the base substrate, wherein a width-to-length ratio of the sixth transistor may be greater than or equal to 5 and less than or equal to 7, or, the width-to-length ratio of the sixth transistor may be greater than or equal to 10 and less than or equal to 14.

13. The display substrate according to claim 1, wherein the driving circuit further includes a sixth transistor and a seventh transistor; the sixth transistor includes a fourth active pattern, and the seventh transistor includes a fifth active pattern;

a gate electrode of the sixth transistor is electrically connected to the first node, a first electrode of the sixth transistor is electrically connected to a first pull-down control node, and a second electrode of the sixth transistor is electrically connected to a third voltage terminal;

a gate electrode of the seventh transistor is electrically connected to the first node, a first electrode of the seventh transistor is electrically connected to a second pull-down control node, and a second electrode of the seventh transistor is electrically connected to the third voltage terminal;

an orthographic projection of at least part of the first electrode of the sixth transistor on the base substrate and an orthographic projection of at least part of the second electrode of the sixth transistor on the base substrate are both within an orthographic projection of the fourth active pattern on the base substrate;

an orthographic projection of at least part of the first electrode of the seventh transistor on the base substrate and an orthographic projection of at least part of the second electrode of the seventh transistor on the base substrate are both within an orthographic projection of the fifth active pattern on the base substrate, wherein a width-to-length ratio of the sixth transistor is greater than or equal to 5 and less than or equal to 7, and a width-to-length ratio of the seventh transistor is greater than or equal to 5 and less than or equal to 7; or the width-to-length ratio of the sixth transistor is greater than or equal to 10 and less than or equal to 14, and the width-to-length ratio of the seventh transistor is greater than or equal to 10 and less than or equal to 14.

14. A method for manufacturing the display substrate according to claim 1, comprising:

forming the first transistor, the second transistor, the first connection structure, and the second connection structure on the base substrate;

arranging the first transistor and the first connection structure to be electrically connected to each other; and/or, arranging the second transistor and the second connection structure to be electrically connected to each other.

15. The method according to claim 14, further comprising:

forming a first metal layer on the base substrate, and performing a patterning process on the first metal layer to form a first connection portion included in the first connection structure, a third connection portion included in the second connection structure, and the gate electrode of the first transistor and the gate electrode of the second transistor;

forming a first insulating layer on a side of the first metal layer away from the base substrate;

forming a second metal layer on a side of the first insulating layer away from the base substrate, and performing a patterning process on the second metal layer to form a first conductive pattern, a second conductive pattern, the first electrode of the first transistor, and the first electrode of the second transistor; the first conductive pattern including a second connection portion and the first electrode of the first transistor that are integrally formed; the second conductive pattern including a fourth connection portion and the second electrode of the second transistor that are integrally formed; the second connection portion being included in the first connection structure; the fourth connection portion being included in the second connection structure;

or the method further comprises:

forming a first metal layer on the base substrate, and performing a patterning process on the first metal layer to form a third conductive pattern, a third connection portion included in a second connection structure, and the gate electrode of the second transistor; the third conductive pattern including a first connection portion and the gate electrode of the first transistor that are integrally formed; the first connection portion being included in the first connection structure;

forming a first insulating layer on a side of the first metal layer away from the base substrate;

forming a second metal layer on a side of the first insulating layer away from the base substrate, and performing a patterning process on the second metal layer to form a first conductive pattern, a fourth connection portion, the first electrode of the first transistor, the first electrode of the second transistor, and the second electrode of the second transistor; the first conductive pattern including a second connection portion and the first electrode of the first transistor that are integrally formed; the second connection portion being included in the first connection structure.

16. The method according to claim 15, further comprising:

forming a second insulating layer on a side of the second metal layer away from the first insulating layer, forming a via hole penetrating the first insulating layer and the second insulating layer, and a via hole penetrating the second insulating layer;

forming a first conductive layer on a side of the second insulating layer away from the second metal layer, so that the first connection portion is electrically connected to the second connection portion through the via hole, and the third connection portion is electrically connected to the fourth connection portion through the via hole;

or forming a via hole penetrating the first insulating layer, so that the first connection portion is electrically connected to the second connection portion through the via hole, and the third connection portion is electrically connected to the fourth connection portion through the via hole.

17. The method according to claim 14, further comprising:

forming a third connection structure, a fourth connection structure, a first reset terminal, and a second reset terminal on the base substrate;

arranging the third connection structure and the first reset terminal to be electrically connected to each other, and the fourth connection structure and the second reset terminal to be electrically connected to each other;

arranging the gate electrode of the second transistor be electrically connected to the third connection structure or the fourth connection structure.

18. The method according to claim 17, further comprising:

forming a first metal layer on a base substrate, and performing a patterning process on the first metal layer to form a fourth conductive pattern and a fifth conductive pattern; the fourth conductive pattern including a fifth connection portion and a first conductive connection portion that are integrally formed, the fifth conductive pattern including a seventh connection portion and a second conductive connection portion that are integrally formed; the first conductive connection portion is electrically connected to the first reset terminal, and the second conductive connection portion is electrically connected to the second reset terminal;

forming a first insulating layer on a side of the first metal layer away from the base substrate;

forming a second metal layer on a side of the first insulating layer away from the base substrate, performing a patterning process on the second metal layer, and forming a sixth connection portion included in the third connection structure and an eighth connection portion included in the fourth connection structure, wherein the method further comprises:

performing a patterning process on the first metal layer to form a sixth conductive pattern; the sixth conductive pattern including the gate electrode of the second transistor and a ninth connection portion that are integrally formed;

performing a patterning process on the second metal layer to form a tenth connection portion, wherein the method further comprises:

arranging the tenth connection portion and the sixth connection portion to be electrically connected to each other;

or arranging the tenth connection portion and the eighth connection portion to be electrically connected to each other;

or forming a second insulating layer on a side of the second metal layer away from the first insulating layer, forming a via hole penetrating the first insulating layer and the second insulating layer, and a via hole penetrating the second insulating layer;

forming a first conductive layer on a side of the second insulating layer away from the second metal layer, so that the fifth connection portion is electrically connected to the sixth connection portion through the via hole, and the seventh connection portion is electrically connected to the eighth connection portion through the via hole, the ninth connection portion is electrically connected to the tenth connection portion through the via hole;

or forming a via hole penetrating the first insulating layer, so that the fifth connection portion is electrically connected to the sixth connection portion through the via hole, and the seventh connection portion is electrically connected to the eighth connection portion through the via hole, the ninth connection portion is electrically connected to the tenth connection portion through the via hole.

19. A display device comprising the display substrate according to claim 1.

* * * * *